United States Patent
Ishimaru et al.

(10) Patent No.: US 9,627,208 B2
(45) Date of Patent: Apr. 18, 2017

(54) SEMICONDUCTOR SWITCH

(71) Applicant: KABUSHIKI KAISHA TOSHIBA, Tokyo (JP)

(72) Inventors: Atsushi Ishimaru, Yokohama Kanagawa (JP); Masami Nagaoka, Ebina Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/842,405

(22) Filed: Sep. 1, 2015

(65) Prior Publication Data

US 2016/0190231 A1   Jun. 30, 2016

(30) Foreign Application Priority Data

Dec. 27, 2014   (JP) .................................. 2014-266807

(51) Int. Cl.
| | | |
|---|---|---|
| *H03K 17/16* | (2006.01) | |
| *H03K 17/81* | (2006.01) | |
| *H01L 23/62* | (2006.01) | |
| *H01L 29/68* | (2006.01) | |
| *H01L 21/263* | (2006.01) | |

(52) U.S. Cl.
CPC .................................. *H01L 21/263* (2013.01)

(58) Field of Classification Search
CPC ... H01L 2223/6677; H01L 2224/48247; H01L 2224/73265; H01L 23/66; H01L 24/45; H01L 24/48; H01L 24/49; H01L 41/28246; H03K 17/063; H03K 17/0822; H03K 17/102; H03K 17/161; H03K 17/693; H03K 19/001; H05B 33/0815; Y10T 307/74; Y10T 307/747
See application file for complete search history.

(56) References Cited

U.S. PATENT DOCUMENTS

| | | | | |
|---|---|---|---|---|
| 3,913,213 A | * | 10/1975 | Mills ................... | H01L 21/8222 257/477 |
| 7,265,604 B2 | | 9/2007 | Yasuda et al. | |
| 8,134,224 B2 | | 3/2012 | Sagae et al. | |
| 8,923,781 B2 | | 12/2014 | Kunishi et al. | |
| 8,952,728 B2 | * | 2/2015 | Takewaki ........... | H03K 19/0016 327/53 |

(Continued)

FOREIGN PATENT DOCUMENTS

| | | |
|---|---|---|
| JP | H08-316420 A | 11/1996 |
| JP | 2006-157264 A | 6/2006 |

(Continued)

OTHER PUBLICATIONS

JP H08-316420 English machine translation.*

*Primary Examiner* — Pamela E Perkins

(74) *Attorney, Agent, or Firm* — Patterson & Sheridan, LLP

(57) ABSTRACT

According to an embodiment, a semiconductor switch includes a first insulating film on a semiconductor substrate, a first semiconductor layer on the first insulating film, a semiconductor switch circuit on the first semiconductor layer, and a wiring on the first insulating film. The first insulating film being between the wiring and the substrate. The wiring connects the semiconductor switch circuit and a terminal. A polycrystalline semiconductor layer is between the wiring and the first insulating film.

18 Claims, 24 Drawing Sheets

(56) References Cited

U.S. PATENT DOCUMENTS

2005/0258769 A1* 11/2005 Imamura ................ G09G 3/006
   315/161
2009/0181630 A1    7/2009 Seshita et al.

FOREIGN PATENT DOCUMENTS

| JP | 2008-227084 A | 9/2008 |
| JP | 2009-194891 A | 8/2009 |
| JP | 2011-151772 A | 8/2011 |

* cited by examiner $\rho 1 \gg \rho 2$

ΔW=(W2−W1)／2＞0

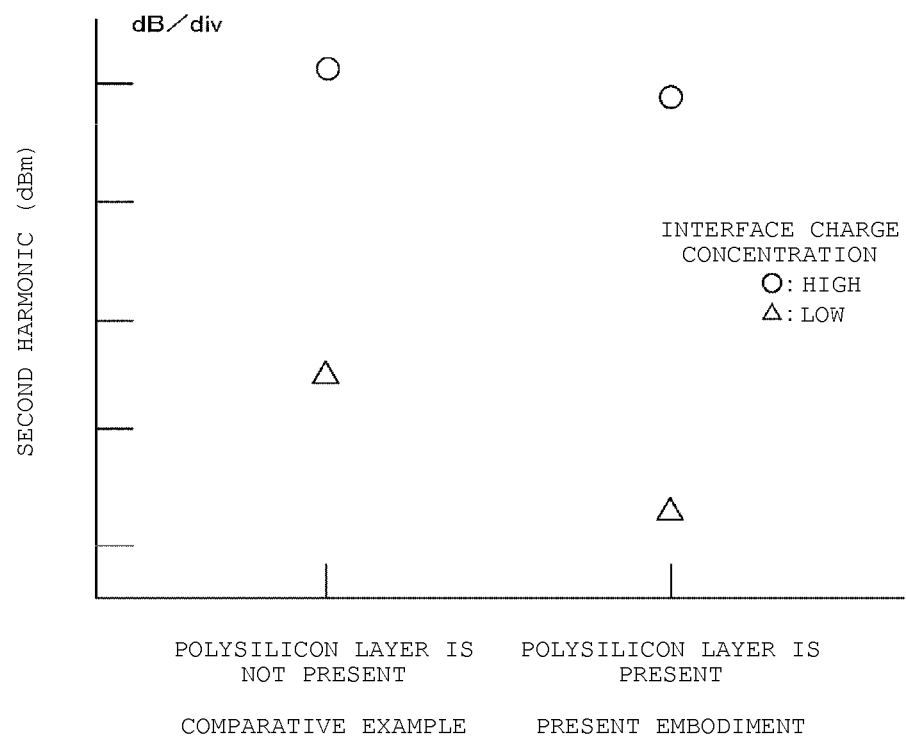

SEMICONDUCTOR SWITCH

CROSS-REFERENCE TO RELATED APPLICATION

This application is based upon and claims the benefit of priority from Japanese Patent Application No. 2014-266807, filed Dec. 27, 2014, the entire contents of which are incorporated herein by reference.

FIELD

Embodiments described herein relate generally to a semiconductor switch.

BACKGROUND

A high frequency switch for switching between a transmitting antenna and a receiving antenna is used in a portable device such as mobile phone or the like. Typically, a semiconductor switch having an insulated gate field effect transistor (such as a MOS transistor) is used as the high frequency switch.

A semiconductor switch may be provided on a silicon-on-insulator (SOI) substrate in which a semiconductor layer disposed on an insulating film that is disposed on a semiconductor substrate via an insulating film. The parasitic capacitances in a high frequency circuit and the semiconductor substrate on which the high frequency circuit is disposed are generally reduced by using a semiconductor substrate having a high electrical resistance, and thus an increase in the speed of the high frequency switch can be achieved.

However, the high frequency switch provided on the SOI substrate has a problem with harmonic distortion generated due to the high frequency signal.

DESCRIPTION OF THE DRAWINGS

FIG. 5 is a diagram illustrating harmonic distortion characteristics of the semiconductor switch according to the first embodiment by comparison with a comparative example.

DETAILED DESCRIPTION

Figure 1:
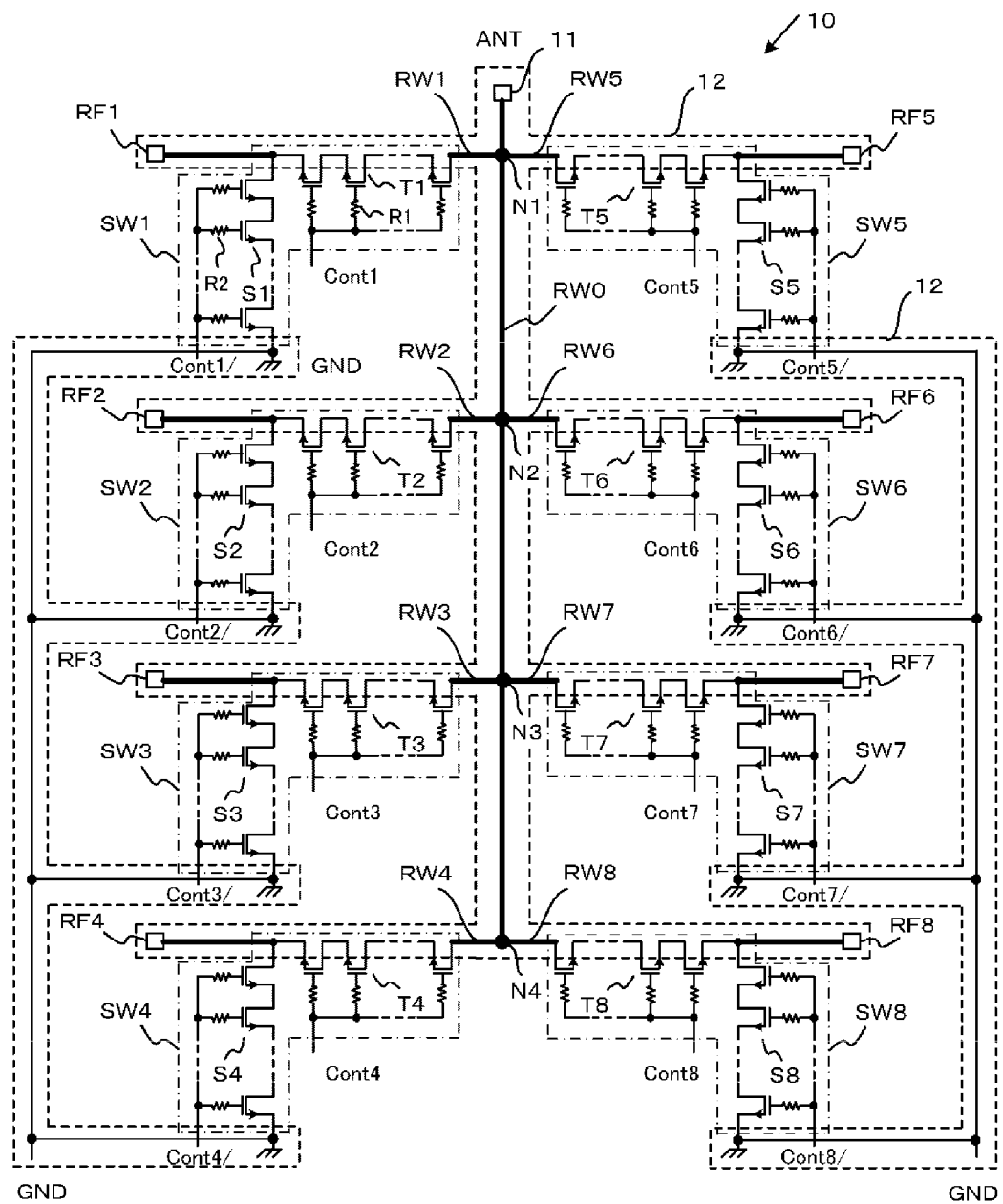
FIG. 1 is a circuit diagram illustrating a semiconductor switch according to a first embodiment.

Embodiments provide a semiconductor switch having reduced harmonic distortion.

In general, according to one embodiment, a semiconductor switch includes a first insulating film on a semiconductor substrate. A first semiconductor layer is on the first insulating film. A semiconductor switch circuit is on the first semiconductor layer. A wiring (or wirings) is on the first insulating film. The first insulating film is between the wiring(s) and the semiconductor substrate. Wiring (or at least one wiring) connects the semiconductor switch circuit and a terminal. A polycrystalline semiconductor layer is between the wiring(s) and the first insulating film.

In general, according to another embodiment, a semiconductor switch includes a semiconductor substrate; a first insulating film that is provided on the semiconductor substrate; a first semiconductor layer that is provided on the first insulating film; a semiconductor switch circuit that is provided on the first semiconductor layer; a wiring that is provided above the first insulating film and on a side opposite to a side on which the semiconductor substrate of the first insulating film is provided, and connects the semiconductor switch circuit and a terminal; and a polycrystalline semiconductor layer that is provided between the wiring and the first insulating film.

In general, according to yet another embodiment, a semiconductor switch includes a first insulating film on a semiconductor substrate. A first semiconductor layer is on the first insulating film. A semiconductor switch circuit is on the first semiconductor layer. A wiring (or wirings) is on the first insulating film. The first insulating film is between the wiring(s) and the semiconductor substrate. The wiring (or at least one wiring) connects the semiconductor switch circuit and a terminal. A conductive layer (such as metal layer, a semiconductor material, or an alloy layer of a metal and semiconductor material) is on the first insulating film. The conductive layer is insulated and separated from the wiring (s) by a second insulating film. The conductive layer having a floating potential and is electrically charged (electrified). In this context, "electrically charged" means to have other than ground potential.

In general, according to still yet another embodiment, a semiconductor switch includes a semiconductor substrate; a first insulating film that is provided on the semiconductor substrate; a first semiconductor layer that is provided on the first insulating film; a semiconductor switch circuit that is provided on the first semiconductor layer; a wiring that is provided above the first insulating film, is provided on a side opposite to a side on which the semiconductor substrate of the first insulating film is provided, and connects the semiconductor switch circuit and a terminal; and a conductive layer that is provided on or above the first insulating film, is insulated and separated by being coated with a second insulating film, and is electrified.

In this context, when one element is stated to be "on" another element, it does not necessarily mean the first element is directly on or contacting the other element, but rather also includes variations in which other layers or elements are between the first element and the other element.

Hereinafter, example embodiments will be described with reference to the accompanying drawings.

First Embodiment

Figure 2:
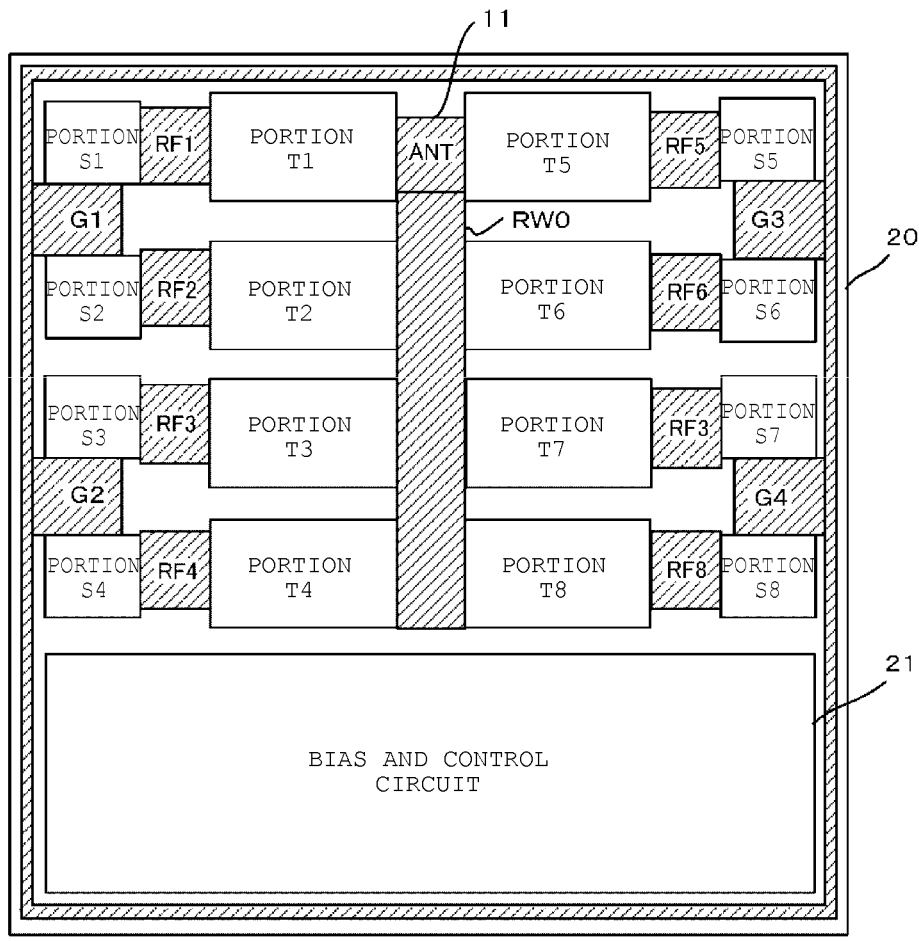
FIG. 2 is a diagram illustrating a semiconductor chip provided with the semiconductor switch according to the first embodiment.
Figure 3:
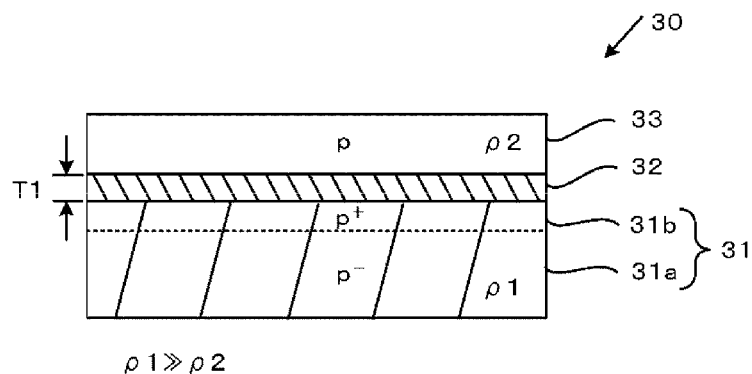
FIG. 3 is a cross-sectional view illustrating an SOI substrate provided with the semiconductor switch according to the first embodiment.
Figure 4A:
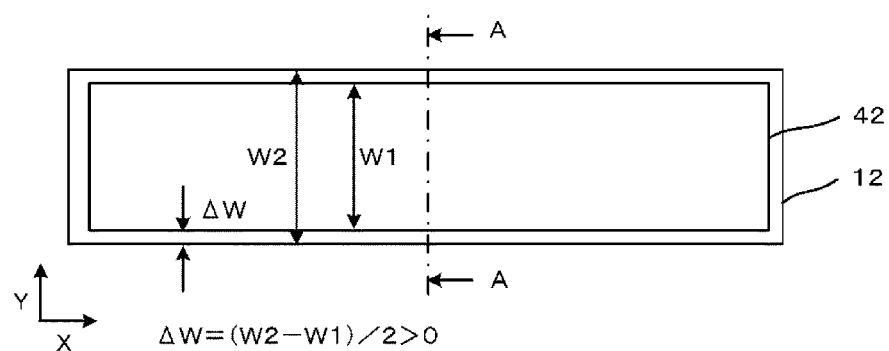
FIGS. 4A and 4B are diagrams illustrating portions of the semiconductor switch according to the first embodiment.
Figure 4B:
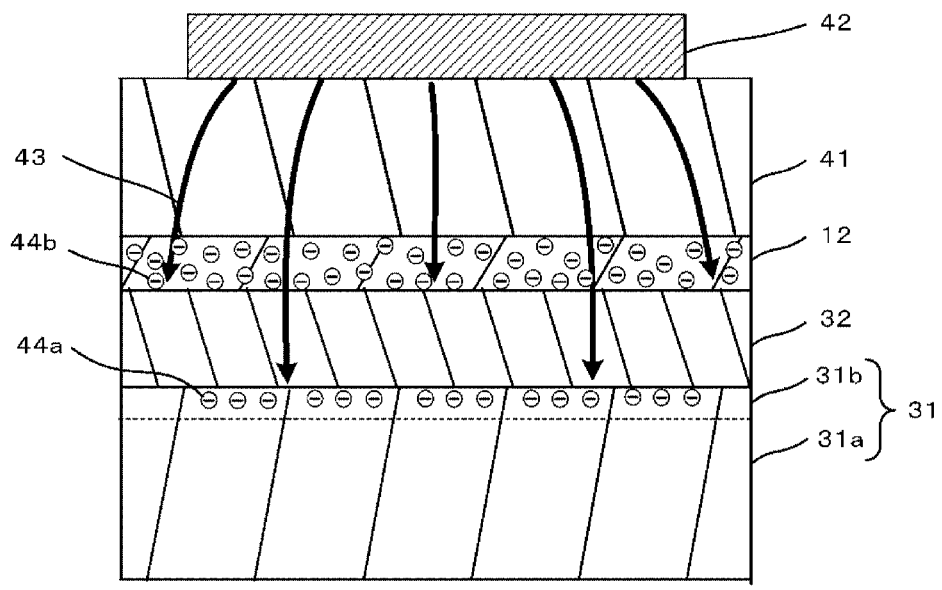

A semiconductor switch according to the first embodiment will be described below with reference to FIG. 1 to FIGS. 4A and 4B. FIG. 1 is a circuit diagram illustrating a semiconductor switch according to the first embodiment. FIG. 2 is a diagram illustrating the disposition of each portion of a semiconductor chip provided with the semiconductor switch. FIG. 3 is a cross-sectional view illustrating a silicon on insulator (SOI) substrate provided with the semiconductor switch. FIGS. 4A and 4B are diagrams illustrating a positional relationship between a high frequency wiring and a polycrystalline semiconductor layer of the semiconductor switch. FIG. 4A is a diagram illustrating a positional relationship as viewed from the upper surface of the semiconductor chip, and FIG. 4B is a cross-sectional view of the semiconductor switch taken along line A-A of FIG. 4A as viewed in the direction of an arrow.

The semiconductor switch of the first embodiment is a high frequency switch, such as for use in, for example, a portable device. The high frequency switch switches between transmission and reception via an antenna, and includes one input/output terminal (common terminal) and a plurality of output/input terminals (individual terminals).

First, the outline of the semiconductor switch will be described.

As illustrated FIG. 1 to FIGS. 4A and 4B, a semiconductor switch 10 according to the first embodiment is provided on a silicon on insulator (SOI) substrate 30. Semiconductor switch circuits (SW1 to SW8) are provided between an antenna terminal and high frequency terminals (RF 1 to RF 8). The semiconductor switch circuits (SW1 to SW8) are connected to the antenna terminal 11 and the high frequency terminals (RF 1 to RF 8) through high frequency wirings (RW0 to RW8).

As illustrated in FIG. 4A, a polycrystalline semiconductor layer 12 is provided below a high frequency wiring 42 with the width of the high frequency wiring 42 being less that the width of the polycrystalline semiconductor layer 12. In addition, as illustrated in FIG. 4B, the polycrystalline semiconductor layer 12 is provided on a silicon substrate 31, but is directly adjacent to a silicon oxide film (first insulating film) 32 in this example. The polycrystalline semiconductor layer 12 is, for example, a polysilicon layer. Hereinafter, the polycrystalline semiconductor layer 12 will be referred to as the polysilicon layer 12.

Figure 6A:
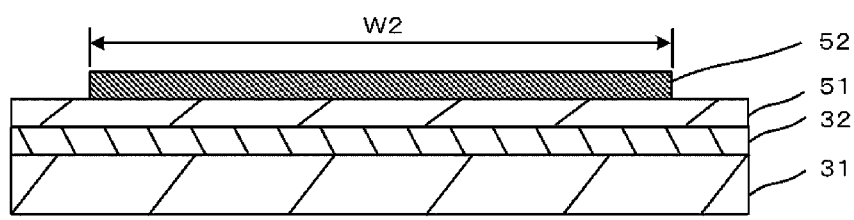
FIGS. 6A to 6C are cross-sectional views sequentially illustrating a process of forming portions of the semiconductor switch according to the first embodiment.
Figure 6B:
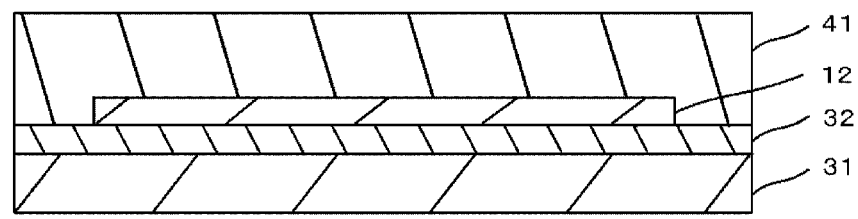
Figure 6C:
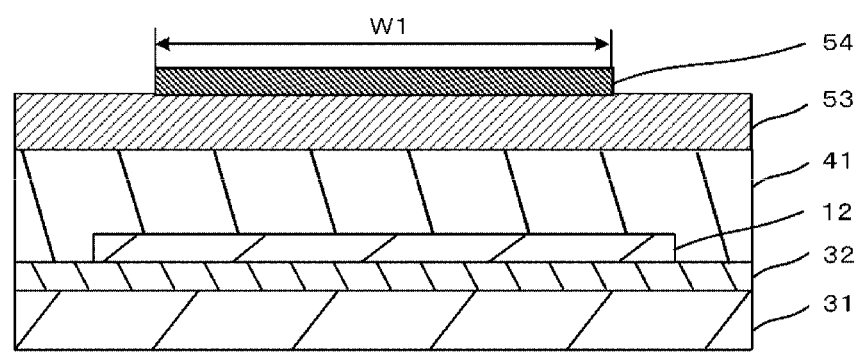

The upper surface and the side surface of the polysilicon layer 12 are covered with an interlayer insulating film (second insulating film) 41 (see FIG. 6B and/or FIG. 6C). The interlayer insulating film 41 being on the side surface of the polysilicon layer 12 is not illustrated in FIGS. 4A and 4B, but see FIG. 6B and/or FIG. 6C. Therefore, the polysilicon layer 12 is electrically insulated from the silicon substrate 31 and a silicon layer 33 on the silicon substrate 31 in or on which the semiconductor switch circuits SW1 to SW8 and the high frequency wirings RW0 to RW8 are formed.

That is, the polysilicon layer 12 is not connected to any high frequency wiring, voltage source, grounding wire, or circuit, and has an electrically floating potential.

The polysilicon layer 12 is doped with n-type impurities at a high concentration. The concentration of the n-type impurities is, for example, approximately $1E20$ $cm^{-3}$. The polysilicon layer 12 has an impurity concentration higher than that of the silicon layer (first semiconductor layer) 33. Here, the term "impurity concentration" as used herein may be regarded as a carrier concentration.

Incidentally, in the SOI substrate 30, there is a tendency for charges (electrons) to be accumulated in the vicinity of an interface between the silicon substrate 31 and the silicon oxide film 32. When a high frequency signal is applied to the high frequency wirings RW0 to RW8, the charges are accelerated and moved by an electric field generated by the high frequency signal. Harmonic distortion due to the movement of these charges thus occurs in the high frequency signal.

In the first embodiment, n-type carriers (electrons) are present in the polysilicon layer 12. Since the mobility of the carriers of the polysilicon layer 12 is lower than that of the single crystal silicon substrate 31, the carriers in the polysilicon layer 12 are less likely to be accelerated and moved by the electric field generated by the high frequency signal.

As a result, the electric field generated by the high frequency signal in high frequency wiring 42 is shielded by the carriers in the polysilicon layer 12. Accordingly, the movement of carriers in the vicinity of the interface between the silicon substrate 31 and the silicon oxide film 32 is suppressed even when a high frequency signal is applied to the high frequency wirings RW0 to RW8.

In some embodiments, silicon substrate 31 may be provided with a second portion 31b that comes into contact with the silicon oxide film 32 (see FIG. 4B). The second portion 31b has an impurity concentration and acceptor concentration which are higher than those of a first portion 31a of the silicon substrate. As a result, an acceptor of the second portion 31b may compensate for the charges in the vicinity of the interface and reduce the density of the charges.

In the first embodiment, a region of the silicon substrate (e.g., first portion 31a) below the high frequency wiring 42 is doped with impurities, and a polycrystalline semiconductor layer (e.g., polysilicon layer 12) having a carrier mobility lower than that of the silicon substrate 31 is also provided. Thus, in the first embodiment, it is possible to reduce harmonic distortion. When a semiconductor switch has more holes and has a longer total distance of high frequency wirings, an effect of preventing the distortion of a high frequency signal is enhanced.

Next, details of the semiconductor switch 10 will be described.

As illustrated in FIG. 1, the semiconductor switch 10 is provided with antenna terminal (common terminal) 11, and eight high frequency terminals (individual terminals) RF1, RF2, RF3, RF4, RF5, RF6, RF7, and RF8. The number of high frequency terminals is not limited to eight and the actual number in a device may be less than or greater than eight. The main high frequency wiring RW0 connects a node N4 sequentially through nodes N1, N2, and N3 to the antenna terminal 11.

The high frequency wiring RW1 connects the node N1 and the high frequency terminal RF1 with the semiconductor switch circuit SW1 being between node N1 and the high frequency terminal RF1. Similarly, the high frequency wirings RW2 to RW8 connect the node N1 and respectively to the high frequency terminals RF2 to RF8 with the semiconductor switch circuits SW2 to SW8 being between the node N1 and the respective high frequency terminal RF2 to RF8.

A high frequency signal has, for example, a frequency of 700 MHz or higher and power of 20 dBm or higher, and can be modulated by a universal mobile telecommunication system (UMTS) scheme, or the like.

For simplicity of description, the high frequency wiring RW1 will be mainly described, but, in general, description of the high frequency wiring RW1 is also applicable to the high frequency wirings RW2 to RW8 other than with respect to specific connections to specific nodes or terminals.

The high frequency wiring RW1 connects the node N1 and the high frequency terminal RF1 through the semiconductor switch circuit SW1. The semiconductor switch circuit SW1 includes a plurality of MOS transistors (hereinafter, referred to as pass-through transistors) T1 connected to each other in series between the node N1 and the high frequency terminal RF1. The semiconductor switch circuit SW1 also includes a plurality of MOS transistors (hereinafter, referred to as shunt transistors) S1 connected to each other in series between the high frequency terminal RF1 and a ground terminal GND.

A resistor R1 for stabilizing a switching operation (e.g., for preventing oscillation) is connected to a gate terminal of each of the pass-through transistors T1. The resistor R1 has a high resistance value such that a high frequency signal does not leak to a bias and control circuit 21 (see FIG. 2) which is connected to the gate terminal of each pass-through transistor T1 through the resistor R1. A resistor R2 is connected to a gate terminal of each of the shunt transistors S1. The resistor R2 prevents a high frequency signal from leaking via the plurality of shunt transistors S1. The resistors R1 and R2 have a resistance of, for example, 100 kΩ or higher.

A control signal Cont1 is applied to the gate terminal of each of the pass-through transistors T1. An inverted control signal Cont1/obtained by inverting the control signal Cont1 is applied to the gate terminal of each of the shunt transistors S1. Accordingly, the pass-through transistor T1 and the shunt transistor S1 are complementarily set to be in an electrical conduction state or an electrical non-conduction state. That is, when the pass-through transistors T1 are in conducting state, the shunt transistors S1 are in a non-conducting state, and vice versa.

For example, in order to set an electrical conduction state between the antenna terminal 11 and the high frequency terminal RF1, the pass-through transistors T1 are set to be in a conductive state, and the shunt transistors S1 are set to be in an electrical non-conduction state. At the same time, all of the pass-through transistors T2 to T8 are set to be in an electrical non-conduction state, and all of the shunt transistors S2 to S8 are set to be in an electrical conduction state.

Here, the potential of the polysilicon layer 12 is floating with respect to the potential of the silicon substrate 31, but may instead be positively biased with respect to the silicon substrate 31 with the polysilicon layer 12 being connected to a positive power supply potential.

FIG. 2 illustrates an example disposition of each unit and terminal within a semiconductor chip. However, the relative sizes of each unit and terminal are not limited to those illustrated in the drawing.

The antenna terminal 11, the high frequency terminals RF1 to RF8, the ground pads G1 to G4, the pass-through transistor portions T1 to T8, and the shunt transistor portions S1 to S8 are disposed on one end (e.g., upper end in FIG. 2) of semiconductor chip 20.

The shunt transistor portions S1 and S2 are connected in common to the ground pad G1. Similarly, the shunt transistor portions S3 and S4 are connected in common to the ground pad G2, the shunt transistor portions S5 and S6 are connected in common to the ground pad G3, and the shunt transistor portions S7 and S8 are connected in common to the ground pad G4.

The bias and control circuit 21 for generating a voltage to be applied to the polysilicon layer 12, control signals Cont1 to Cont8, and inverted control signals Cont1/ to Cont8/ is disposed on the other end (e.g., lower end in FIG. 2) of the semiconductor chip 20.

In FIG. 2 a hatched-shaded region depicts the polysilicon layer 12. That is, the polysilicon layer 12 is below the high frequency wiring RW0 (and the high frequency wirings RW1 to RW8 not shown in FIG. 2). Further, the polysilicon layer 12 is also below the antenna terminal 11 and the high frequency terminals RF1 to RF8. In addition, the polysilicon layer 12 may be provided below the ground pads G1 to G4 and below the ground wiring GND (see FIG. 1) provided at the outer circumference so as to surround various switching units and terminals. The ground wiring GND is disposed so as to surround the antenna terminal 11, the high frequency terminals RF1 to RF8, the ground pads G1 to G4, the pass-through transistor portions T1 to T8, the shunt transistor portions S1 to S8, and the bias and control circuit 21. The ground pads G1 to G4 are connected to the ground wiring GND.

FIG. 3 is a cross-sectional view illustrating a silicon on insulator (SOI) substrate provided with a semiconductor switch. An SOI substrate 30 includes a p-type silicon substrate (semiconductor substrate) 31 having a first specific resistance $\rho 1$, a silicon oxide film (first insulating film) 32 provided on the silicon substrate 31, and a p$^-$-type silicon layer (first semiconductor layer) 33 which is provided on the silicon oxide film 32 and has a second specific resistance $\rho 2$ that is lower than that of the first specific resistance $\rho 1$.

Since the silicon substrate 31 is a supporting substrate, it is preferable that the first specific resistance ρ1 is higher than the second specific resistance ρ2 in order to reduce parasitic capacitance with respect to the silicon layer 33 which is an active layer.

The silicon substrate 31 includes the first portion 31a having the first specific resistance ρ1 and the second portion 31b which is provided on the first portion 31a and has an impurity concentration higher than that of the first portion 31a. The second portion 31b comes into contact with the silicon oxide film 32. The thickness of the second portion 31b is, for example, approximately 0.5 μm to 1 μm.

The first specific resistance ρ1 is, for example, 1 kΩ·cm or greater. The second specific resistance ρ2 is, for example, approximately 10 Ω·cm. The silicon oxide film 32 has a thickness T1 of, for example, approximately 1 μm to 2 μm. The thickness of the silicon layer 33 is, for example, approximately 0.1 μm to 1 μm.

The silicon oxide film 32 may also be referred to as a buried oxide (BOX) layer. The silicon layer 33 is also referred to as a SOI layer.

The impurities in the second portion 31b are, for example, boron (B) serving as an acceptor. The acceptor generates holes. Charges (electrons) accumulated in the vicinity of the interface between the silicon oxide film 32 and the silicon substrate 31 are compensated by holes. Accordingly, the density of the charges in the vicinity of the interface is reduced by the presence of impurities in the second portion 31b.

N-type impurities of approximately 1E20 $cm^{-3}$ are added to the polysilicon layer 12, for example, by ion implantation. The thickness of the polysilicon layer 12 is, for example, 210 nm. An upper portion of the polysilicon layer 12 may be provided with a silicide of a high melting point metal.

The interlayer insulating film 41 is provided on the polysilicon layer 12. The thickness of the interlayer insulating film 41 is, for example, 3.6 μm. The high frequency wiring 42 is provided on the interlayer insulating film 41.

Accordingly, the polysilicon layer 12 is provided on the silicon oxide film 32 and between the high frequency wiring 42 and the silicon substrate 31.

The high frequency wiring 42 and the polysilicon layer 12 have, for example, a stripe shape. A direction in which the high frequency wiring 42 extends is set to an X direction, and a direction perpendicular to the X direction is set to a Y direction. The width (length in the Y direction) of the high frequency wiring 42 is set to W1, and the width (length in the Y direction) of the polysilicon layer 12 is set to W2.

The polysilicon layer 12 extends beyond an edge of the high frequency wiring 42 as viewed in plan view. That is, a width W2 of the polysilicon layer 12 is larger than a width W1 of the high frequency wiring 42 (W2>W1). The polysilicon layer 12 protrudes beyond the edge of the high frequency wiring 42 in the width direction by ΔW=(W2−W1)/2.

A similar relationship is true of the length of the high frequency wiring 42 in the X direction and the length of the polysilicon layer 12 in the X direction, and further description thereof will be omitted here. Thus, in general, the area (in plan view) of the polysilicon layer 12 is larger than the area (in plan view) of the high frequency wiring 42.

Here, operations and effects of the first embodiment will be described with reference to FIGS. 4A and 4B and the high frequency wiring 42 and the polysilicon layer 12; however, it should be readily apparent that similar operations and effects will also be exhibited between the polysilicon layer 12 and the pads of the high frequency terminals RF1 to RF8; between the polysilicon layer 12 and the ground pads G1 to G4; and the polysilicon layer 12 and the ground wiring GND.

When a high frequency signal is applied to the high frequency wiring 42, electric force 43 (depicted as arrows in FIG. 4B) is generated. The reason why the width W2 of the polysilicon layer 12 is set to be larger than the width W1 of the high frequency wiring 42 is because electric force 43 generated by high frequency will typically extend further than the edge of the high frequency wiring 42.

The width W1 of the high frequency wiring 42 is determined in consideration of, for example, high frequency loss, characteristic impedance, and the like. When a high frequency power is, for example, approximately 20 dBm, the width W1 of the high frequency wiring 42 is, for example, approximately 50 μm. The width W2 of the polysilicon layer 12 is determined in accordance with the expected or estimated degree of spreading of the lines of electric force, for example, a distance between the polysilicon layer 12 and the high frequency wiring 42 (thickness of the interlayer insulating film 41) can be relevant to expected degree of electric field spreading. The width W2 of the polysilicon layer 12 is, for example, approximately 1.5 times the width W1 of the high frequency wiring 42, and is approximately 70 μm.

Charges (electrons) 44a are accumulated in the vicinity of the interface between the silicon substrate 31 and the silicon oxide film 32. A large number of charge carriers (electrons) 44b are present in the polysilicon layer 12.

The lines of electric force 43 act on the charges 44a and 44b. The charges 44a and 44b are accelerated and moved by an electric field induced by a high frequency signal in the high frequency wiring 42.

However, since the mobility of the carriers of the polysilicon layer 12 is lower than that in the single crystal silicon substrate 31, the charges 44b do not easily move a substantial distance, and thus the probability of the charges remaining localized in the polysilicon layer 12 becomes higher.

The charges 44b having a small mobility act to shield an electric field caused by the high frequency signal in the conductive layer (e.g., high frequency wiring 42) above the polysilicon layer 12. As a result, the strength (number of lines in FIG. 4B) of electric force 43 acting on the charges 44a is reduced. Accordingly, an effect of suppressing the movement of the charges 44a is enhanced. Thereby, the harmonic distortion of a high frequency signal and the high frequency loss in the high frequency wiring 42 are reduced.

FIG. 5 is a diagram illustrating harmonic distortion of the semiconductor switch 10 according to the first embodiment in comparison with a semiconductor switch according to a comparative example. The semiconductor switch according to the comparative example here refers to a semiconductor switch that does not include the polysilicon layer 12 according to the first embodiment.

In FIG. 5, a vertical axis represents a second harmonic power (dBm) included in a high frequency signal. The frequency of the high frequency signal is 1.95 GHz, and an input power is 20 dBm. A parameter is an interface charge concentration (concentration of the interface charges 44a).

The interface charges may be measured by, for example, scanning capacitance microscopy (SCM). The SCM is a method of scanning a semiconductor surface using a conductively-coated probe and two-dimensionally visualizing charge distribution. In the SCM, a signal which has sensitivity in charge concentration of approximately $10^{15}$ $cm^{-3}$ to $10^{20}$ $cm^{-3}$ and is correlated with charge concentration is obtained. However, in the SCM, it is difficult to perform quantitative evaluation and relative values between samples are more easily obtained.

Samples of the first embodiment and the comparative example are classified into a sample having a high interface charge concentration and a sample having a low interface charge concentration. In FIG. 5, the interface charge concentration of the high concentration sample indicated by a mark ○ is 7E15 cm$^{-3}$, and the interface charge concentration of the low concentration sample indicated by a mark Δ is 2E15 cm$^{-3}$.

As illustrated in FIG. 5, in comparison between the samples having a high interface charge concentration which are indicated by the mark ○, the second harmonic power of the semiconductor switch 10 according to the first embodiment is reduced by approximately 1 dB as compared with that of the semiconductor switch according to the comparative example. In the comparison between the samples having a low interface charge concentration which are indicated by the mark Δ, the second harmonic power of the semiconductor switch 10 according to the first embodiment is reduced by approximately 12 dB as compared with that of the semiconductor switch according to the comparative example.

In both a case where the interface charge concentration is high and a case where the interface charge concentration is low, it is confirmed that the second harmonic power of the semiconductor switch 10 according to the first embodiment is reduced as compared with that of the semiconductor switch according to the comparative example.

In addition, the amount of reduced second harmonic power is larger between the samples having a low interface charge concentration. Accordingly, when a polysilicon layer is provided in a semiconductor switch having a low interface charge concentration, it is possible to further improve harmonic distortion.

Next, a method of manufacturing the semiconductor switch 10 will be described. FIGS. 6A to 6C are cross-sectional views sequentially illustrating main portions in a process of particularly forming high frequency wiring portions of the semiconductor switch 10.

As illustrated in FIG. 6A, a polysilicon film 51 is formed on the silicon oxide film 32 (the surface of which can be exposed by removing the silicon layer 33) by, for example, a chemical vapor deposition (CVD) method. The polysilicon film 51 is doped with, for example, phosphorus (P) as n-type impurities.

A silicon oxide film (not shown) is then formed on the surface of the polysilicon film 51 by, for example, a thermal oxidation method. A resist film 52 being in a stripe shape and having the width W2 is formed on the polysilicon film 51 by, for example, a lithography method. The polysilicon film 51 is etched using the resist film 52 as a mask by a reactive ion etching (RIE) method, for example. Thereby, the polysilicon layer 12 having a stripe-shape and the width W2 is obtained by patterning the polysilicon film 51.

As illustrated in FIG. 6B, the interlayer insulating film 41, for example, a tetra ethyl ortho silicate (TEOS) film, is formed by a CVD method on the silicon oxide film 32, to cover the upper surface and the side surface of the polysilicon layer 12.

As illustrated in FIG. 6C, a conductive film 53, for example, a metal film is formed on the interlayer insulating film 41 by a sputtering method. A resist film 54 being in a stripe-shape (corresponding to the shape of polysilicon film 12) having the width W1 is formed on the conductive film 53 by, for example, a lithography method. The conductive film 53 is etched using the resist film 54 as a mask by, for example, a RIE method. Thereby, the high frequency wiring 42 having a stripe shape and the width W1 is obtained by patterning the conductive film 53.

Meanwhile, the SOI substrate 30 can be obtained by a separation by implantation of oxygen (SIMOX) method or a bonding method. A high-concentration acceptor-type dopants in the second portion 31b may be obtained by an ion implantation method through the silicon oxide film 32.

As described above, in the semiconductor switch 10 according to the first embodiment, the polysilicon layer 12 is provided between the high frequency wiring 42 and the silicon substrate 31 and on (adjacent to) the silicon oxide film 32. The polysilicon layer 12 has charge carrier mobility lower than that of the silicon layer 33, and has a floating potential with respect to the silicon substrate 31. A large number of charge carriers (electrons) 44b are present in the polysilicon layer 12.

Since the charge mobility of the polysilicon layer 12 is low, the charges 44b tend to stay in place (or nearly so) even when the electric force 43 generated by a high frequency signal act thereon.

Since the lines of electric force 43 are shielded by the low mobility charges 44b, the number of lines of electric force 43 acting on the charges 44a generated in the vicinity of the interface between the silicon substrate 31 and the silicon oxide film 32 is reduced.

Accordingly, the movement of the charges 44a at the interface is suppressed, and thus it is possible to prevent distortion from occurring in a high frequency signal. Further, it is possible to reduce the power loss of the high frequency wiring 42.

As described above, the polysilicon layer 12 reduces second harmonic distortion. In addition, when the polysilicon layer 12 is provided in the semiconductor switch having the second portion 31b in the silicon substrate 31, that is, when the polysilicon layer 12 is provided in a semiconductor switch having a low interface charge concentration, second harmonic distortion is reduced as illustrated in FIG. 5.

The polysilicon layer 12 may be formed of the same material as used for gate wirings of the pass-through transistors T1 to T8 and the shunt transistors S1 to S8.

Figure 7:
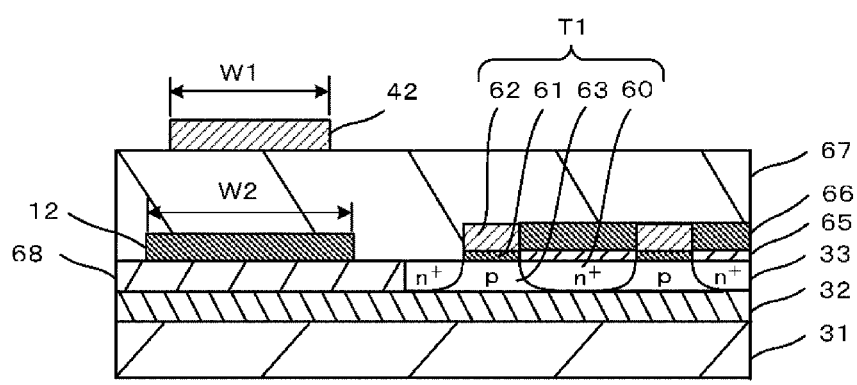
FIG. 7 is a cross-sectional view illustrating other portions of the semiconductor switch according to the first embodiment.

FIG. 7 is a cross-sectional view illustrating the polysilicon layer 12 being formed of the same material as that of a gate wiring (e.g., gate wiring 66). As illustrated in FIG. 7, the pass-through transistor T1 includes a pair of source and drain layers 60 provided in a region obtained by processing the silicon layer 33 into an island-shaped layer, a gate insulating film 61 provided on the silicon layer 33 between the source and drain layers 60, and a gate electrode 62 provided on the gate insulating film 61.

The silicon layer 33 located under the gate insulating film 61 is a channel layer 63. The plurality of pass-through transistors T1 are connected to each other in series so as to share the source and drain layer 60.

An interlayer insulating film 65 which is the same film as the gate insulating film 61 is provided on the source and drain layer 60. A gate wiring 66 connected to the gate electrode 62 is provided on the interlayer insulating film 65. That is, the gate electrode 62 and the gate wiring 66 are disposed in the same layer (device level).

A shallow trench isolation (STI) layer 68 for electrically separating the source and drain layers 60 is provided on the silicon oxide film 32 which is exposed by removing the silicon layer 33. The STI layer 68 is a silicon oxide film formed by, for example, a CVD method.

The polysilicon layer 12 is formed on the STI layer 68. However, the gate insulating film 61 is not provided on the STI layer 68. The STI layer 68 has a thickness of, for example, 60 nm, and is sufficiently thinner than the silicon oxide film 32 (2 μm).

Accordingly, the STI layer 68 and the silicon oxide film 32 may, in some embodiments, be collectively regarded as a single silicon oxide film, and thus the polysilicon layer 12 provided on the STI layer 68 has the same operations and effects as those of the polysilicon layer 12 provided on the silicon oxide film 32.

An interlayer insulating film 67 is provided so as to cover the gate wiring 66 and the polysilicon layer 12. The high frequency wiring 42 is provided above the polysilicon layer 12 and on the interlayer insulating film 67.

An example manufacturing process is as follows.

Silicon insulating films serving as the gate insulating film 61 and the interlayer insulating film 65 are formed on the silicon layer 33. The source and drain layers 60 are formed in the silicon layer 33 by ion implantation through the silicon insulating films (61 and 65).

The source and drain layers 60 and the channel layer 63 are formed, and then the surrounding silicon insulating films (61 and 65) and the silicon layer 32 are removed from areas outside the active element region.

The STI layer 68 is formed on the silicon oxide film 32 which has been exposed by removing the silicon insulating films (61 and 65) and the silicon layer 33. A polysilicon film doped with impurities is formed on the remaining silicon insulating films (61 and 65) and the STI layer 68 as a gate wiring material film.

The gate electrode 62 is obtained by processing the gate wiring material film that is disposed on the gate insulating film 61. The gate wiring 66 is obtained by processing the gate wiring material film that is disposed on the interlayer insulating film 65. The polysilicon layer 12 is obtained by processing the gate wiring material film that is disposed on the STI layer 68.

The upper portions of the gate wiring 66, the gate electrode 62, and the polysilicon layer 12 are converted to a silicide by forming a high melting point metal, for example, a film of tungsten (W) or molybdenum (Mo) on the polysilicon film and performing thermal treatment. The thickness of the silicide layer (not separately depicted) is, for example, approximately 50 nm. The polysilicon film has an impurity concentration of, for example, $1E15$ $cm^{-3}$ or higher and has a sheet resistance of, for example, $10\Omega/\square$.

As described above, the polysilicon layer 12 may be formed through the same process as that of the gate wiring 66, and thus there is an advantage in that the manufacturing process is simplified. A high frequency switch having a configuration illustrated in FIG. 7 has second harmonic characteristics that are the same as the second harmonic characteristics illustrated in FIG. 5.

In addition, in some embodiments, the polysilicon layer 12 is provided on the silicon insulating film without removing the silicon insulating films and the silicon layer 33. In this case, the pn junction and separation of the pass-through transistors T1 to T8 and the shunt transistors S1 to S8 are performed by inclusion of the $p^-$-type region in silicon layer 33.

Figure 8:
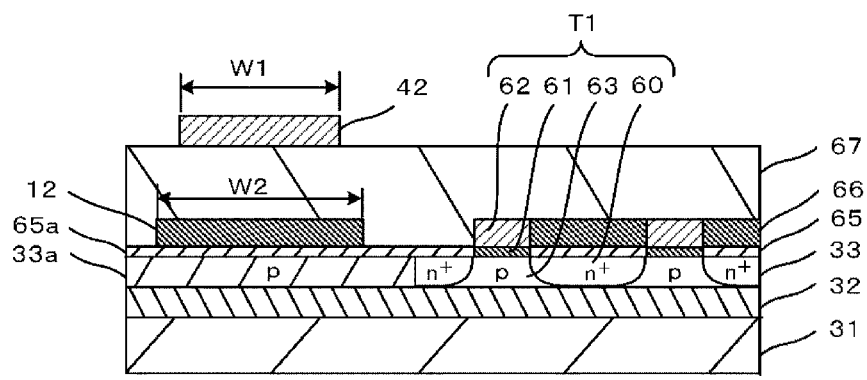
FIG. 8 is a cross-sectional view illustrating other portions of the semiconductor switch according to the first embodiment.

FIG. 8 is a cross-sectional view illustrating the polysilicon layer 12 provided on an interlayer insulating film 65a.

As illustrated in FIG. 8, the interlayer insulating film 65a is provided on a silicon layer 33a. The polysilicon layer 12 is provided on the interlayer insulating film 65a. The polysilicon layer 12 is obtained by processing a gate wiring material film formed on the interlayer insulating film 65a.

In a high frequency switch having the configuration illustrated in FIG. 8, charges are generated in the vicinity of an interface between the silicon layer 33a and the silicon oxide film 32, in addition to the charges 44a generated in the vicinity of the interface between the silicon substrate 31 and the silicon insulating film 32.

However, similarly to the charges 44a, the movement of the charges generated in the vicinity of the interface between the silicon layer 33a and the silicon oxide film 32 is suppressed. Accordingly, even when the silicon layer 33a is disposed between the polysilicon layer 12 and the silicon substrate 31, the silicon layer does not adversely affect second harmonic characteristics.

As described above, the high frequency switch having the configuration illustrated in FIG. 8 does not require a process of forming the STI layer 68, as compared with the high frequency switch having the configuration illustrated in FIG. 7, and thus there is an advantage in that a manufacturing process is further simplified. The high frequency switch having the configuration illustrated in FIG. 8 has the same second harmonic characteristics as the second harmonic characteristics illustrated in FIG. 5.

Figure 9A:
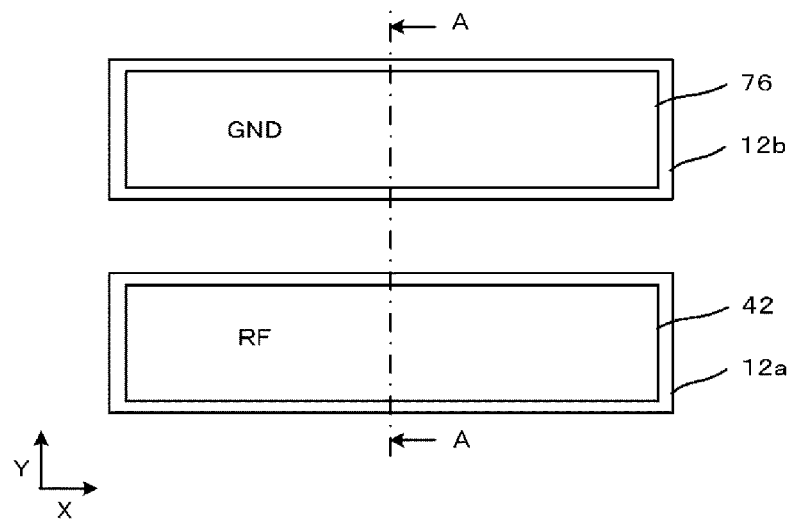
FIGS. 9A and 9B are cross-sectional views illustrating other portions of the semiconductor switch according to the first embodiment.
Figure 9B:
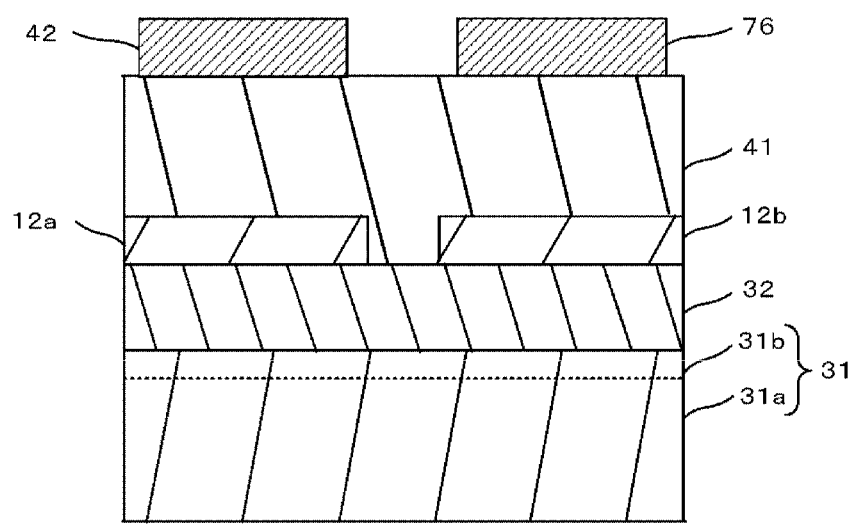

The polysilicon layer 12 may be provided not only below the high frequency wiring 42 but also below the ground wiring. FIGS. 9A and 9B are diagrams illustrating a polysilicon layer (12a and 12b) provided below a high frequency wiring 42 and a ground wiring 76, respectively.

As illustrated in FIGS. 9A and 9B, the high frequency wiring 42 and a ground wiring 76 are disposed on the interlayer insulating film 41 so as to be parallel to each other. A polysilicon layer 12a is provided below the high frequency wiring 42, and a polysilicon layer 12b is provided below a ground wiring 86. The polysilicon layer 12a and the polysilicon layer 12b are separated from each other—that is, polysilicon layer 12a and 12b are not formed as a continuous layer and are not connected to each other by polysilicon material.

The providing of the polysilicon layer 12b below the ground wiring 76 results in improved harmonic distortion characteristics and reduces the power loss of the high frequency wiring when a high frequency signal is induced to the ground wiring 76.

Although a case where the second portion 31b of the silicon substrate 31 and the silicon oxide film 32 are in direct contact with each other is described; however, it is also possible in some embodiments to provide another layer, for example, a modified layer between the second portion 31b and the silicon oxide film 32.

This modified layer is formed of, for example, silicon including crystal defects. The probability of the charges 44a at the interface being trapped in the crystal defects of the modified layer becomes higher, and thus the movement of charges in the vicinity of the interface is further suppressed.

The modified layer may be formed, for example, as follows. The vicinity of an interface between the second portion 31b and the silicon oxide film 32 is irradiated with a pulse laser beam having a wavelength that substantially passes through a silicon oxide film from the silicon oxide film 32 side.

Since the second portion 31b absorbs a laser beam and is locally melted and solidified, a portion of the second portion 31b becomes a modified layer. Meanwhile, since the silicon layer 33 is thin, the influence of the laser beam absorption in the silicon layer 33 is negligible.

Alternatively, the vicinity of the interface is irradiated with a highly repetitive short-pulse laser beam having a wavelength that substantially passes through a silicon oxide film and silicon and is condensed up to a diffraction limit level. The laser beam is temporally and spatially compressed to an extremely localized region in the vicinity of a light converging point and thus has an extremely high peak power density.

A laser beam having transmittance with respect to silicon locally has an extremely high absorption characteristic when the peak power density exceeds a certain threshold value. The peak power density is controlled to exceed the threshold value only near a focal point/region in the vicinity of the interface, and thus the silicon layer 33 is not damaged, and a portion of the second portion 31b becomes a modified layer.

The modified layer does not need to be provided over the entire surface of the SOI substrate 30. The modified layer may in some embodiments be provided only in region below the high frequency wiring 42.

As another example, in some embodiments, another silicon layer, for example, a layer having a different impurity concentration or a layer having a different conductive type may be provided between the silicon oxide film 32 and the silicon layer 33. The semiconductor switch circuits SW1 to SW8 may be configured with a junction field-effect transistor or the like.

A case where the polycrystalline semiconductor layer is a polysilicon layer is described, but the polycrystalline semiconductor layer may in fact, in some embodiments, be an amorphous silicon layer. That is, as used herein "polycrystalline semiconductor layer" can include a polysilicon layer and an amorphous silicon layer. In general, the carrier mobility of the amorphous silicon layer is lower than the carrier mobility of the polysilicon layer.

Second Embodiment

Figure 10A:
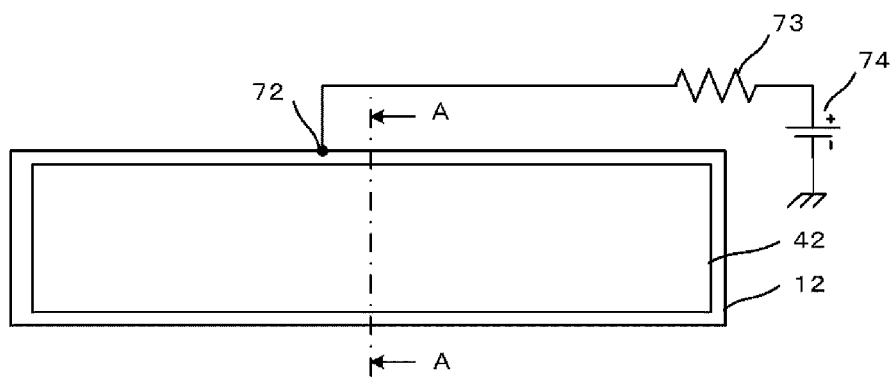
FIGS. 10A and 10B are diagrams illustrating portions of a semiconductor switch according to a second embodiment.
Figure 10B:
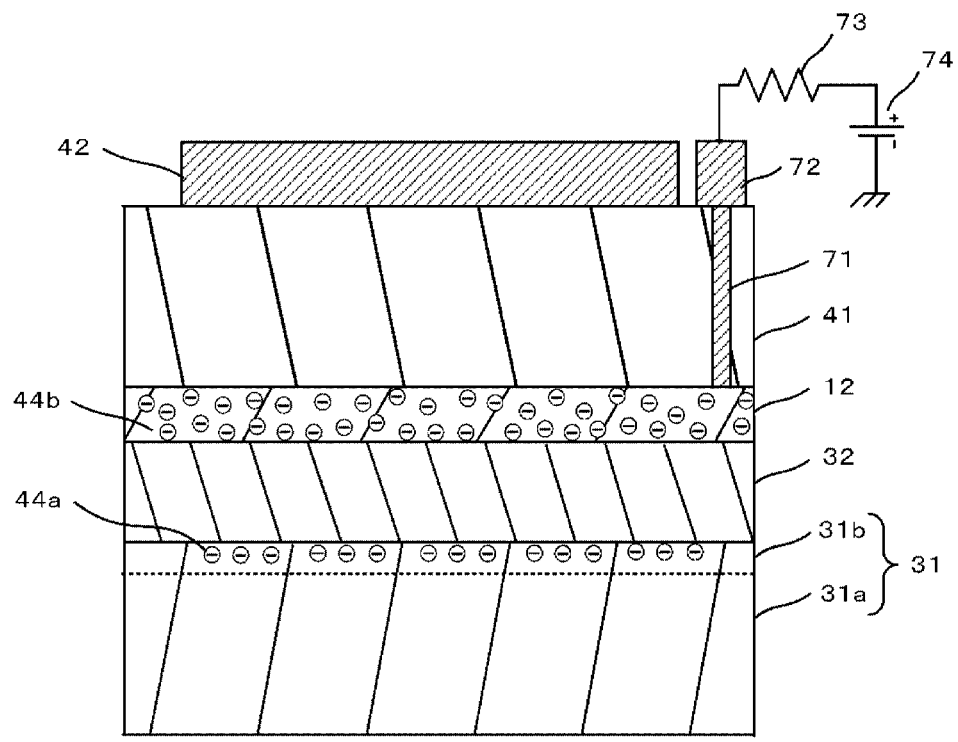

A semiconductor switch according to the second embodiment will be described with reference to FIGS. 10A and 10B. FIGS. 10A and 10B are diagrams illustrating a positional relationship between a high frequency wiring 42 and a second semiconductor layer 12 of the semiconductor switch according to the second embodiment. FIG. 10A is a diagram illustrating a positional relationship as viewed from the upper surface of the semiconductor chip, and FIG. 10B is a cross-sectional view of the semiconductor switch taken along line A-A of FIG. 10A as viewed in the direction of an arrow.

In the second embodiment, the same components as those in the above-mentioned first embodiment are denoted by the same reference numerals and signs and may not be further described here, and, primarily, different components will be described. The second embodiment is different from the first embodiment in that a polysilicon layer 12 is positively biased with respect to a silicon substrate 31.

That is, as illustrated in FIGS. 10A and 10B, in the semiconductor switch according to the second embodiment, a via 71 is provided in the vicinity of a high frequency wiring 42. The via 71 passes through an interlayer insulating film 41 and comes into contact with the polysilicon layer 12.

A pad 72 connected to a via 71 is provided on the interlayer insulating film 41. The pad 72 is connected to a power supply 74 through a resistor 73. The resistor 73 has a sufficiently large resistance value so that the polysilicon layer 12 is floating with respect to a high-frequency signal. For example, a value of 200 kΩ or greater is typically suitable for this resistance value.

A positive voltage is applied to the polysilicon layer 12, and this layer is positively biased with respect to the silicon substrate 31. Charges 44a at an interface between the silicon substrate 31 and a silicon oxide film 32 are attracted to the polysilicon layer 12 side by a Coulomb's force.

As a result, the free movement of the charges 44a at the interface is suppressed, and thus it is possible to further prevent distortion from occurring in a high frequency signal. Further, it is possible to further reduce the power loss of the high frequency wiring 42.

As described above, in the semiconductor switch according to the second embodiment, a positive voltage is applied to the polysilicon layer 12 and is positively biased with respect to the silicon substrate 31. As a result, the charges 44a at the interface are further attracted by a Coulomb's force, and thus the free movement thereof is suppressed.

In combination with an effect of shielding electric force 43 using charges 44b at the interface between the polysilicon layer 12 and the silicon oxide film 32 and a reduction in the density of the charges 44a using the high-concentration acceptor of a second portion 31b, it is possible to further prevent distortion from occurring in a high frequency signal. Further, it is possible to further reduce the power loss of the high frequency wiring 42.

Third Embodiment

Figure 11A:
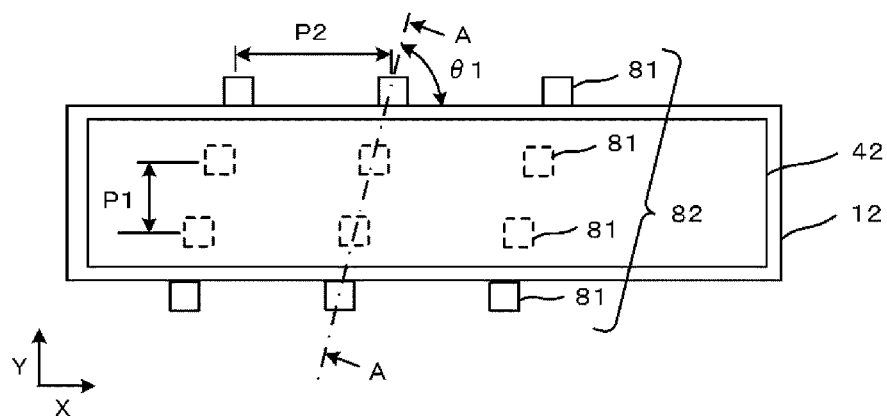
FIGS. 11A and 11B are diagrams illustrating portions of a semiconductor switch according to a third embodiment.
Figure 11B:
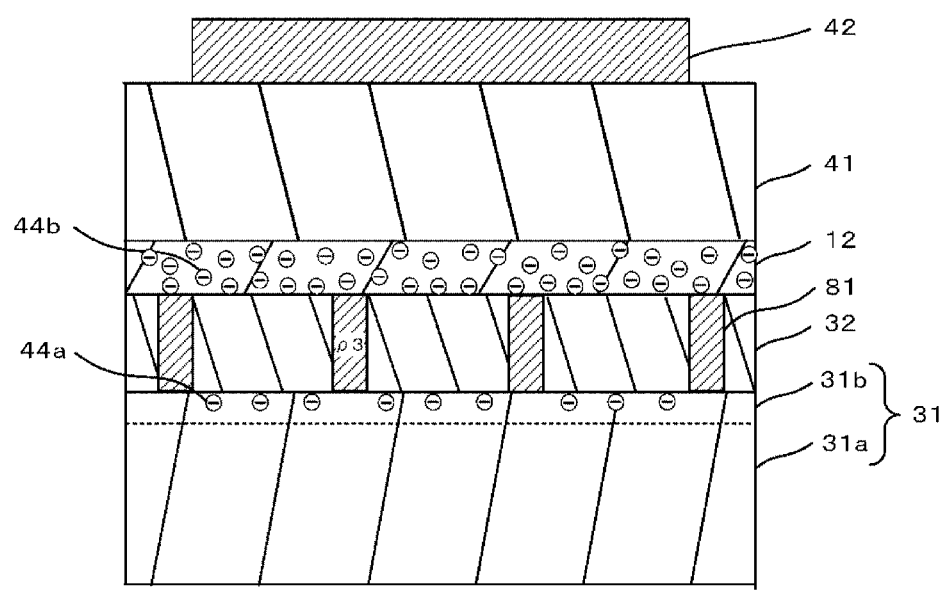

A semiconductor switch according to the third embodiment will be described with reference to FIGS. 11A and 11B. FIGS. 11A and 11B are diagrams illustrating a positional relationship between a high frequency wiring 42, a polycrystalline semiconductor layer 12, and a via 81 of the semiconductor switch according to the third embodiment. FIG. 11A is a diagram illustrating the positional relationship therebetween as viewed from the upper surface of a semiconductor chip, and FIG. 11B is a cross-sectional view of the semiconductor switch taken along line A-A of FIG. 11A as viewed in the direction of an arrow.

In the third embodiment, the same components as those in the first embodiment are denoted by the same reference numerals and signs and description of substantially similar elements may be omitted and only differences described. The third embodiment is different from the first embodiment in that a plurality of cylinders (e.g., vias 81) passing through a silicon oxide film are provided.

That is, as illustrated in FIGS. 11A and 11B, in the semiconductor switch according to the present embodiment, a plurality of vias (cylinders) 81 passing through a silicon oxide film 32 and coming into contact with silicon substrate 31 are provided. The via 81 has a third specific resistance $\rho 3$ which is higher than a first specific resistance $\rho 1$ of the silicon substrate 31. The third specific resistance $\rho 3$ is, for example, approximately $1 \times 10^6$ Ω·cm to $1 \times 10^9$ Ω·cm.

For example, via 81 is formed of a polysilicon film including both a large amount of donor impurities and a large amount of acceptor impurities. When the donor impurities and the acceptor impurities are set to have substantially the same concentration, the donor and the acceptor mutually compensate for each other, and polysilicon having a high third specific resistance $\rho 3$ is obtained (impurity compensation effect).

For example, the plurality of vias 81 are obliquely disposed at a predetermined angel $\theta 1$ with respect to the X direction in which a high frequency wiring 42 extends as viewed in plan view. The vias 81 are disposed at a predetermined interval P1 in the Y direction. A group of vias 81 obliquely disposed may be referred to as a via group 82. The vias 81 at both ends of the via group 82 are disposed beyond an outer edge of the high frequency wiring 42. The via groups 82 are disposed at a predetermined interval P2 in the X direction.

In the third embodiment, since the vias 81 come into contact with the silicon substrate 31, the silicon oxide film 32 is not present under the vias 81. Accordingly, since an interface between the silicon oxide film 32 and the silicon substrate 31 is not present, there is no charge accumulated under the vias 81 where without the presence of vias 81 an interface between silicon oxide film 32 and the silicon substrate 31 would exist. As a result, it is possible to reduce the amount of charges 44a accumulated in the vicinity of the interface.

In general, polysilicon contains a large amount of crystal defects. Accordingly, the probability of charges that passes under the vias 81 being trapped in the crystal defects becomes higher, and thus it is possible to further reduce the amount of charges 44a accumulated in the vicinity of the interface.

As a result, it is possible to further prevent distortion from occurring in a high frequency signal. Further, it is possible to further reduce the power loss of the high frequency wiring 42.

As described above, in the semiconductor switch according to the third embodiment, the plurality of vias 81 passing through the silicon oxide film 32 and coming into contact with the silicon substrate 31 are provided. Since the vias 81 reduce the area of the interface and trap charges passing under the vias 81, it is possible to reduce the amount of charges 44a.

In combination with an effect of shielding electric force using charges 44b at the interface between the polysilicon layer 12 and the silicon oxide film 32 and a reduction in the density of the charges 44a using the high-concentration acceptor of a second portion 31b, it is possible to further prevent distortion from occurring in a high frequency signal. Further, it is possible to further reduce the power loss of the high frequency wiring 42.

Since the via 81 and the polysilicon layer 12 come into contact with each other, the vias 81 may be positively biased with respect to the silicon substrate 31 in the same manner as the semiconductor switch illustrated in FIGS. 9A and 9B. The vias 81 attract the surrounding charges by a Coulomb's force and limit the free movement of the charges.

The effect of the third embodiment is obtained even when the vias 81 do not come into contact with the polysilicon layer 12.

Fourth Embodiment

Figure 12A:
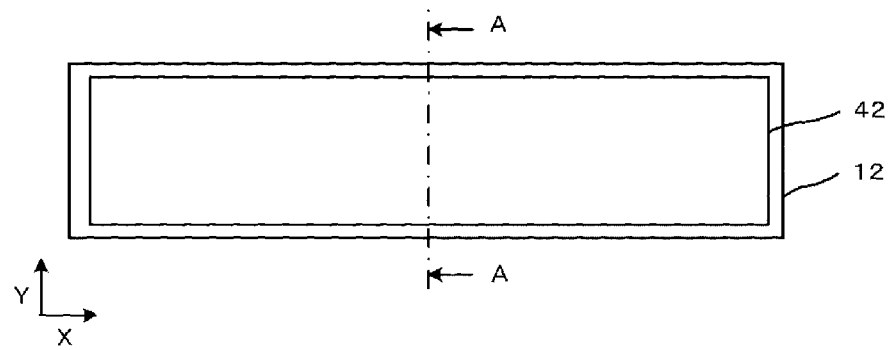
FIGS. 12A and 12B are diagrams illustrating portions of a semiconductor switch according to a fourth embodiment.
Figure 12B:
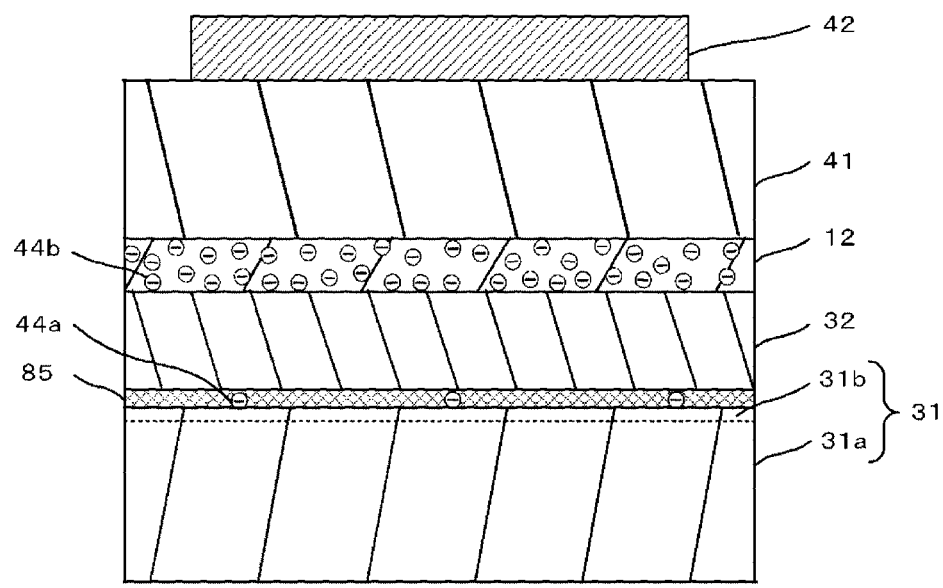

A semiconductor switch according to the fourth embodiment will be described below with reference to FIGS. 12A and 12B. FIGS. 12A and 12B are diagrams illustrating a positional relationship between a high frequency wiring 42 and a polycrystalline semiconductor layer 12 of the semiconductor switch according to the fourth embodiment. FIG. 12A is a diagram illustrating a positional relationship as viewed from the upper surface of the semiconductor chip, and FIG. 12B is a cross-sectional view of the semiconductor switch taken along line A-A of FIG. 12A as viewed in the direction of an arrow.

In the fourth embodiment, the components which are substantially similar to those in the first embodiment are denoted by the same reference numerals and signs and are not necessarily described here, and, in general, only difference will be described. The fourth embodiment is different from the first embodiment in that a layer having a charge trap level is further provided between a silicon substrate and a silicon oxide film.

That is, as illustrated in FIGS. 12A and 12B, a semiconductor switch according to the fourth embodiment includes a layer 85 having a charge trap level (hereinafter, referred to as a charge trap level layer). The charge trap level layer 85 is provided between a silicon substrate 31 and a silicon oxide film 32. The charge trap level layer 85 is provided below a high frequency wiring 42.

The charge trap level layer 85 refers to a silicon layer having such a deep level so as to effectively trap charges. In the silicon layer, an electronic level (defect level) is generated in a forbidden band due to defects caused by impurities or the disturbance (stress/strain) of a structure.

For example, a deep level transient spectroscopy (DLTS) method can be used as a method of measuring the defect level. The DLTS method is a method of detecting a change in a charged state of a defect level associated with the trapping of charges or the discharge of carriers from the defect level, as a change in capacitance between terminals of a capacitive element (MIS capacitive element) which includes a Schottky junction diode and a laminated body of a metal, an insulating film, and a semiconductor.

The charge trap level layer 85, which is, for example, an epitaxial layer containing oxygen, may be obtained by setting conditions such as a growth temperature and a process gas concentration so that a charge trap level concentration increases. The epitaxial growth method can be used, and thus the charge trap level layer 85 may be formed on the entire surface of the silicon substrate 31. The charge trap level concentration is, for example, approximately $1E16$ $cm^{-3}$ to $1E18$ $cm^{-3}$.

In the fourth embodiment, first, charges 44a at an interface are trapped by the charge trap level layer 85, and thus the amount of charges 44a accumulated in the vicinity of the interface is reduced. Next, the charges 44a are compensated by a high-concentration acceptor of a second portion 31b, and the amount of charges 44a accumulated in the vicinity of the interface is further reduced. The movement of remaining charges 44a is suppressed by a shielding effect of lines of electric force using charges 44b at the interface between the polysilicon layer 12 and the silicon oxide film 32.

As a result, it is possible to further prevent distortion from occurring in a high frequency signal. Further, it is possible to further reduce the power loss of the high frequency wiring 42.

As described above, the semiconductor switch according to the fourth embodiment includes the charge trap level layer 85 between the silicon substrate 31 and the silicon oxide film 32. Since the charge trap level layer 85 traps the charges 44a at the interface, the amount of charges 44a accumulated in the vicinity of the interface is reduced.

In combination with a shielding effect of the electric force using charges 44b at the interface between the polysilicon layer 12 and the silicon oxide film 32 and a reduction in the density of the charges 44a using the high-concentration acceptor of a second portion 31b, it is possible to further prevent distortion from occurring in a high frequency signal. Further, it is possible to further reduce the power loss of the high frequency wiring 42.

Figure 13A:
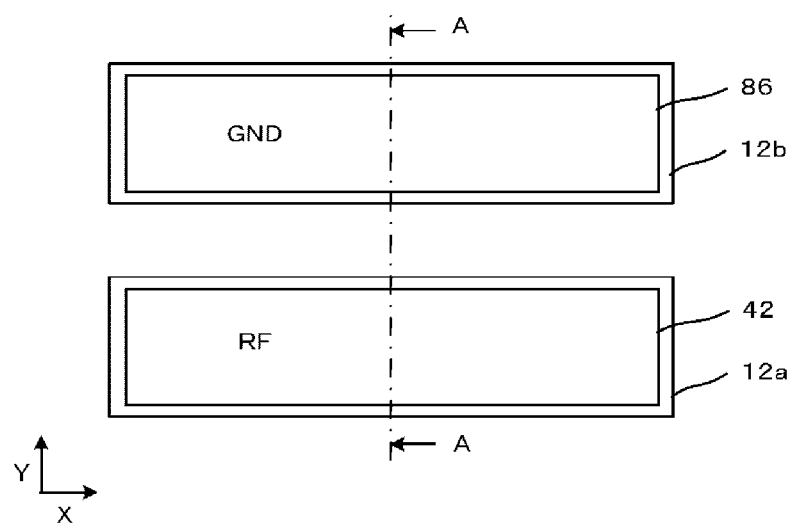
FIGS. 13A and 13B are diagrams illustrating portions of another semiconductor switch according to the fourth embodiment.
Figure 13B:
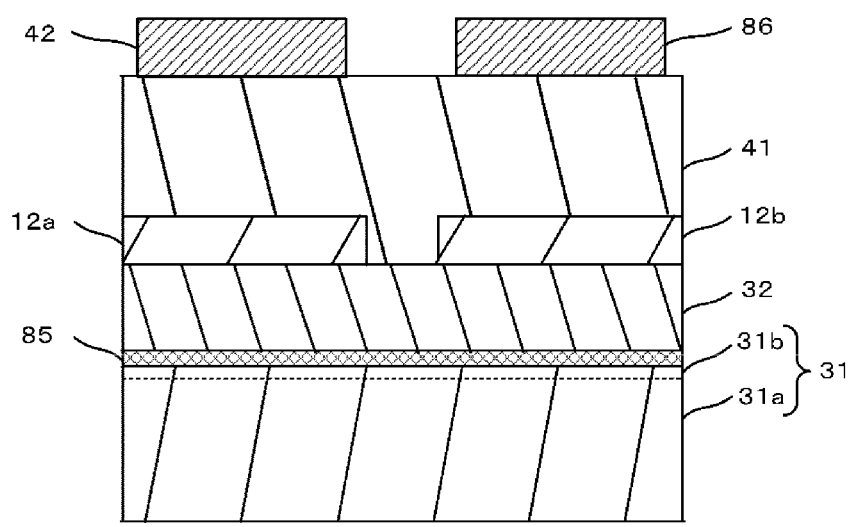
Figure 14A:
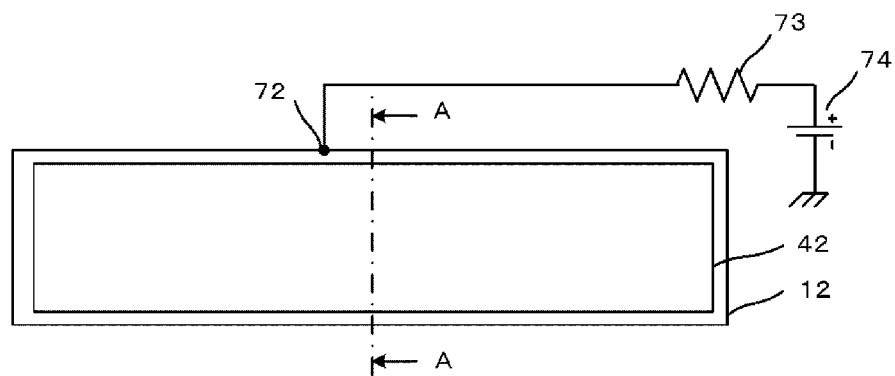
FIGS. 14A and 14B are diagrams illustrating portions of another semiconductor switch according to the fourth embodiment.
Figure 14B:
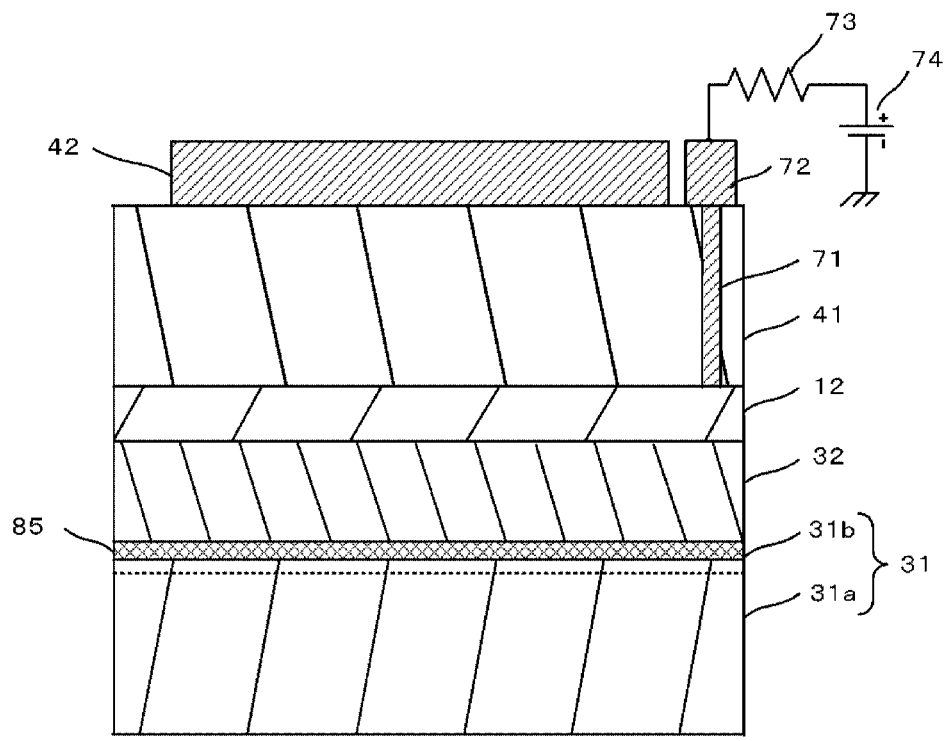
Figure 15A:
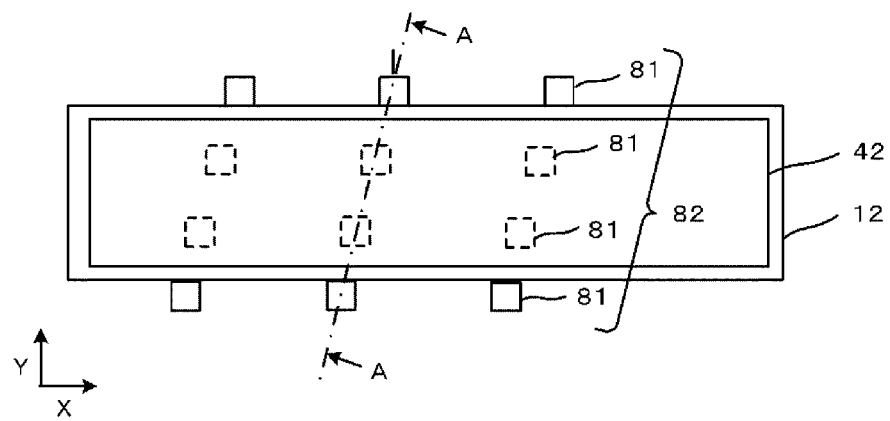
FIGS. 15A and 15B are diagrams illustrating portions of another semiconductor switch according to the fourth embodiment.
Figure 15B:
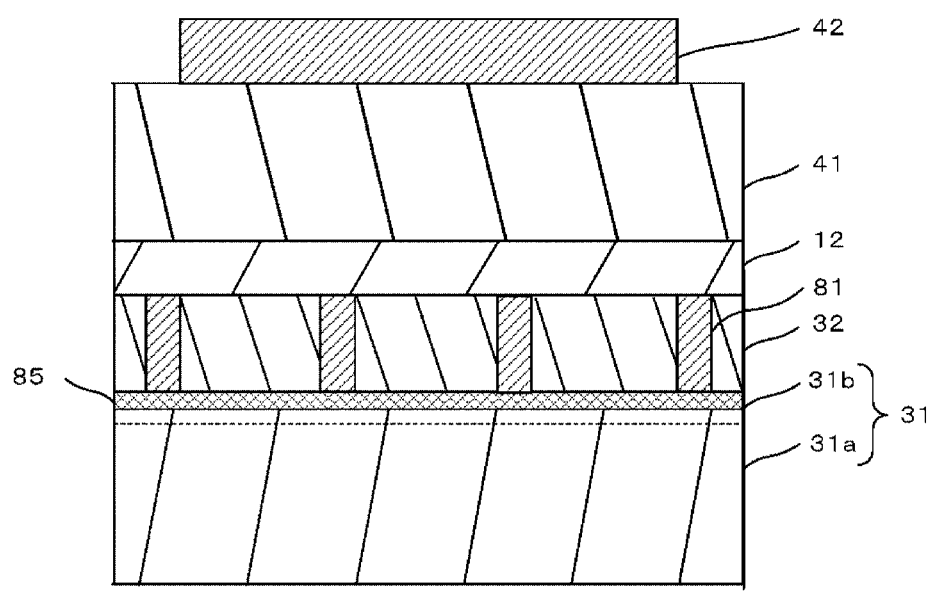

The charge trap level layer 85 may also be included in the semiconductor switches illustrated in FIGS. 9A and 9B to FIGS. 11A and 11B. FIGS. 13A and 13B are diagrams illustrating main portions of the semiconductor switch provided with the charge trap level layer 85 in the semiconductor switch illustrated in FIGS. 9A and 9B. FIGS. 14A and 14B are diagrams illustrating main portions of the semiconductor switch provided with the charge trap level layer 85 in the semiconductor switch illustrated in FIGS. 10A and 10B. FIGS. 15A and 15B are diagrams illustrating main portions of the semiconductor switch provided with the charge trap level layer 85 in the semiconductor switch illustrated in FIGS. 10A and 10B.

As an extreme example, when an effect of reducing charges at an interface using the charge trap level layer 85 in the semiconductor switch illustrated in FIGS. 15A and 15B is sufficient, an effect of reducing harmonic distortion characteristics and the power loss of a high frequency wiring may be obtained even without the polysilicon layer 12.

Figure 16A:
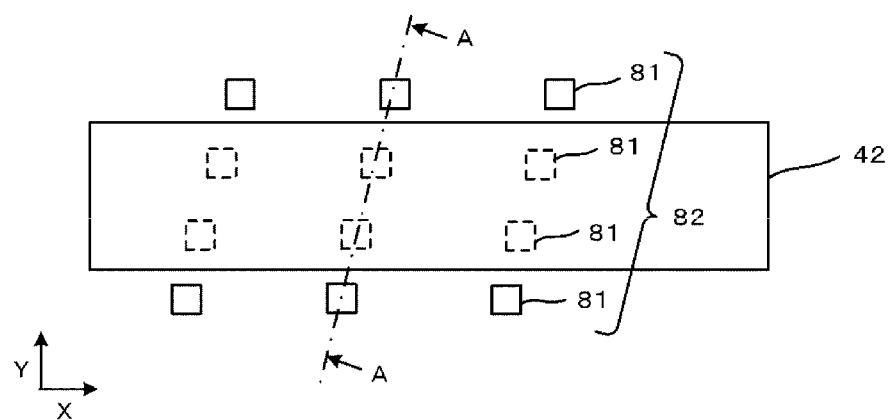
FIGS. 16A and 16B are diagrams illustrating portions of still another semiconductor switch according to the fourth embodiment.
Figure 16B:
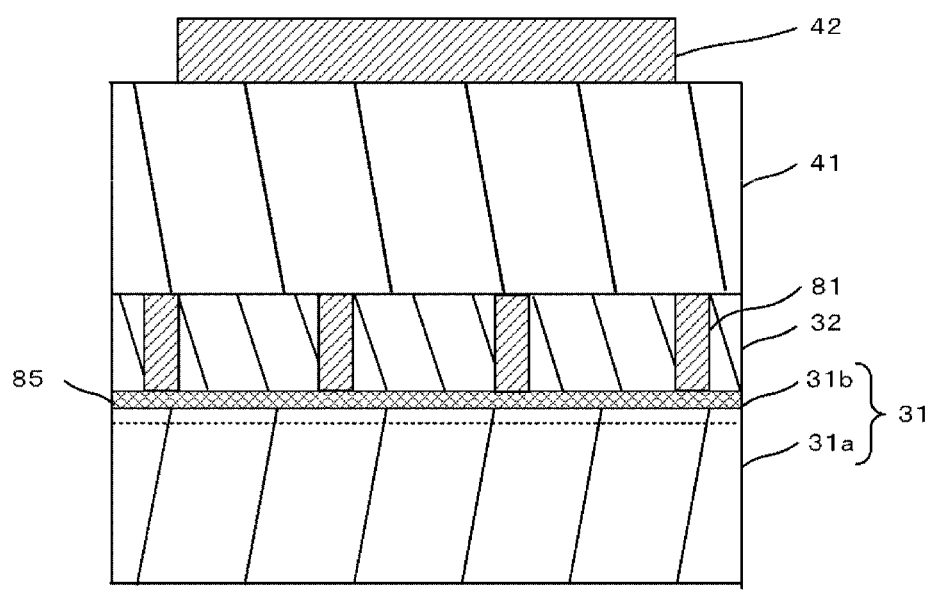

FIGS. 16A and 16B are diagrams illustrating main portions of a semiconductor switch obtained by inclusion of the polysilicon layer 12 in the semiconductor switch illustrated in FIGS. 15A and 15B.

Figure 17A:
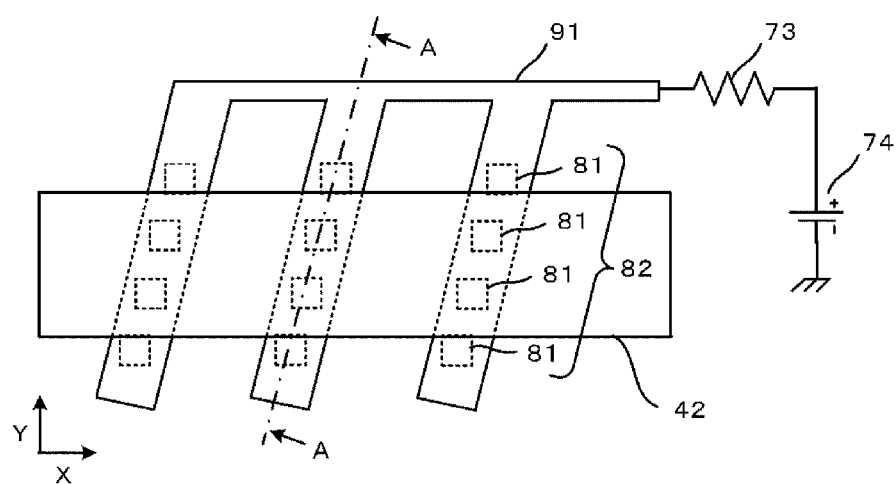
FIGS. 17A and 17B are diagrams illustrating portions of still another semiconductor switch according to the fourth embodiment.
Figure 17B:
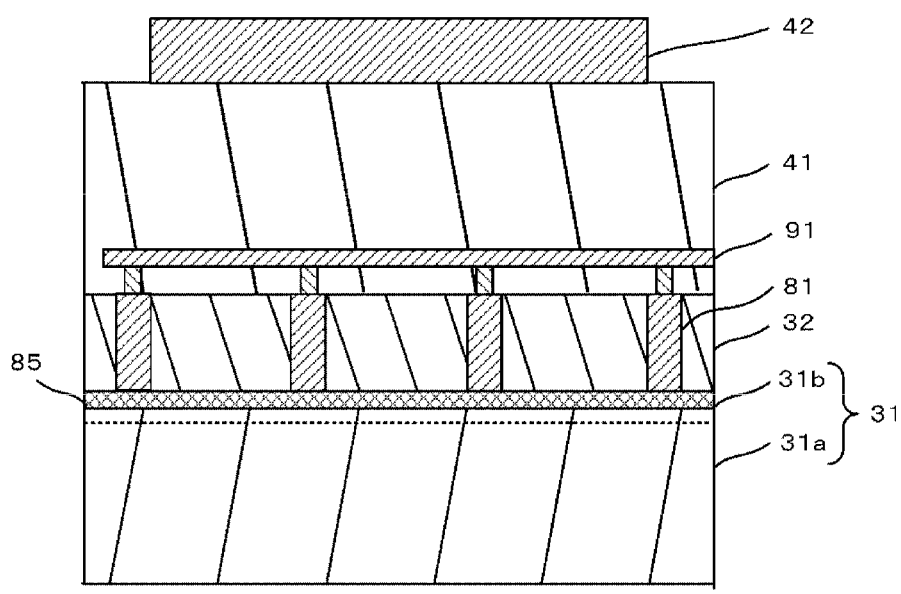

In addition, a bias voltage may also be applied to vias 81. FIGS. 17A and 17B are diagrams illustrating main portions of the semiconductor switch in which a bias voltage is applied to vias 81 in the semiconductor switch illustrated in FIGS. 16A and 16B.

As illustrated in FIGS. 17A and 17B, one end of the via 81 is connected in common to a lead-out wiring 91 and is connected to a positive voltage source 74 through a resistor 73. The vias 81 are thus positively biased with respect to the silicon substrate 31.

Fifth Embodiment

Figure 18:
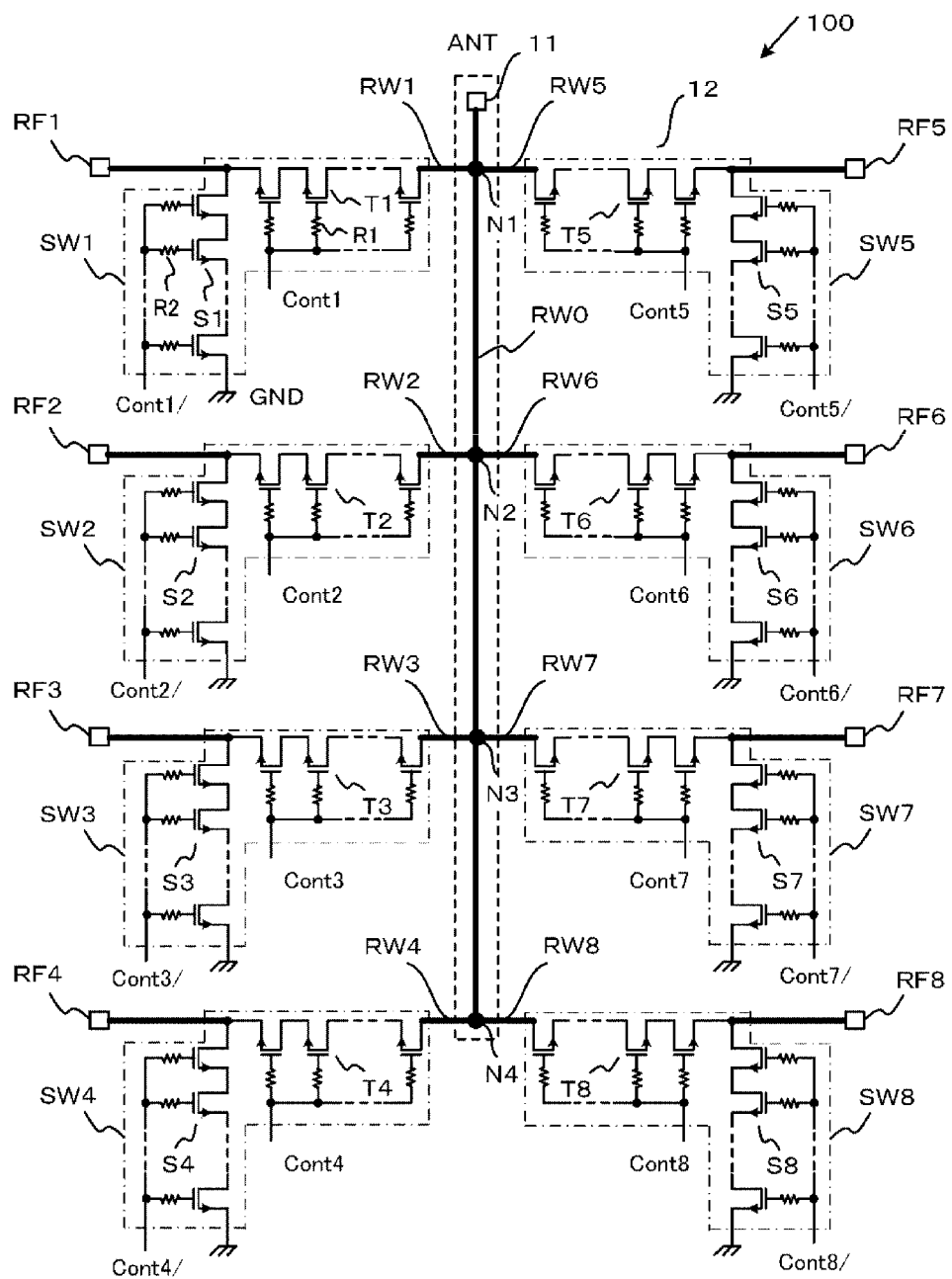
FIG. 18 is a circuit diagram illustrating a semiconductor switch according to a fifth embodiment.
Figure 19:
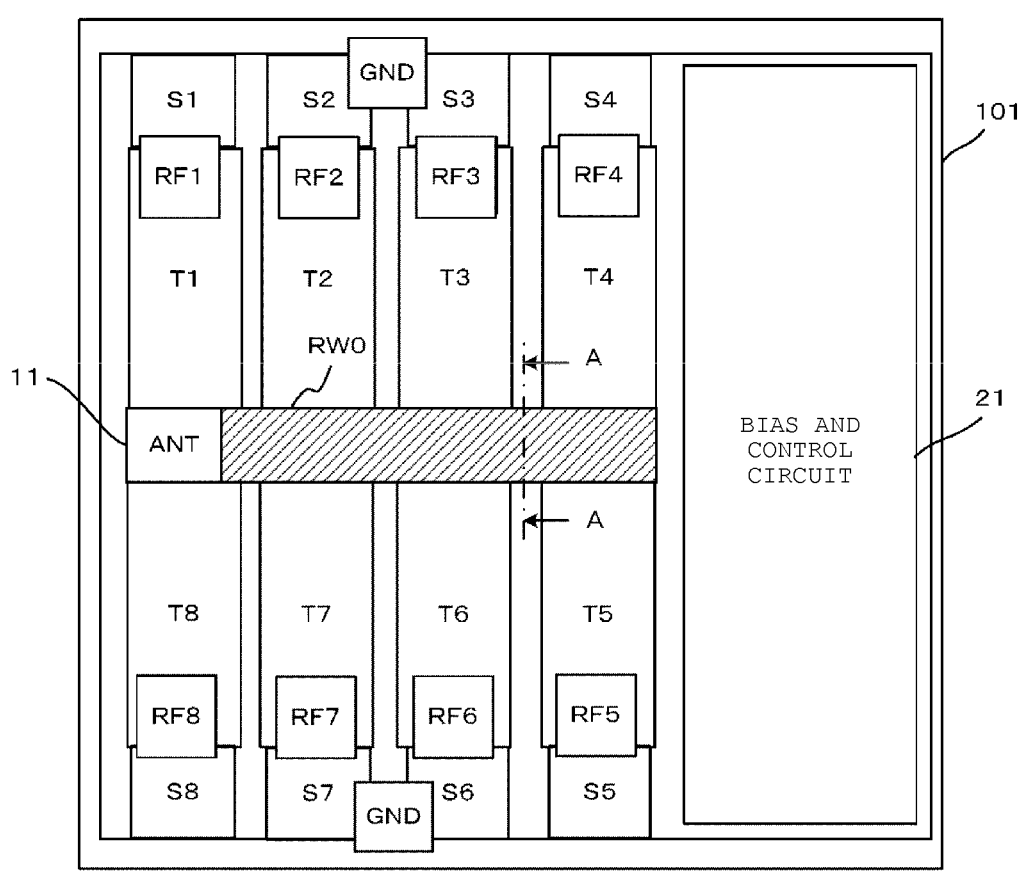
FIG. 19 is a diagram illustrating a semiconductor chip provided with the semiconductor switch according to the fifth embodiment.
Figure 20:
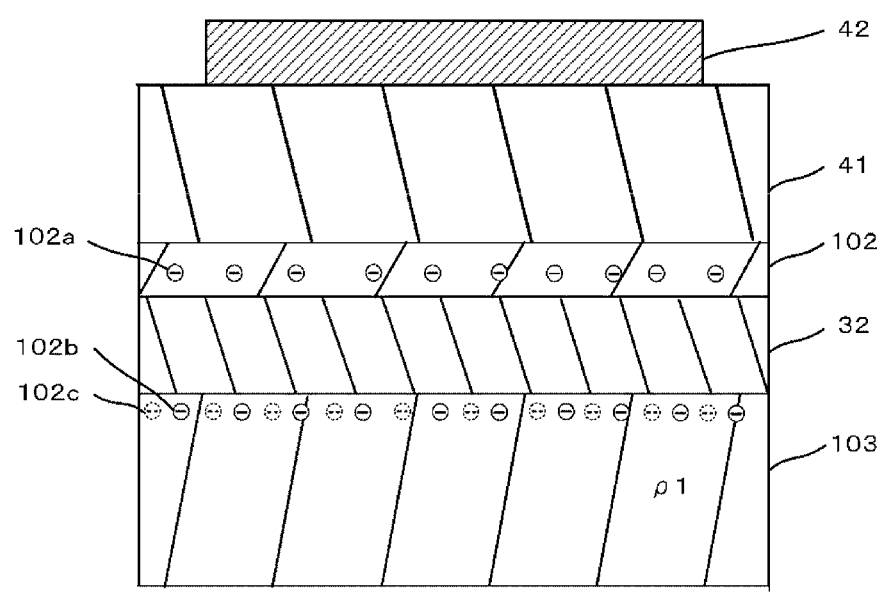
FIG. 20 is a cross-sectional view illustrating portions of the semiconductor switch according to the fifth embodiment.

A semiconductor switch according to the fifth embodiment will be described below with reference to FIGS. 18 to 20. FIG. 18 is a circuit diagram illustrating a semiconductor switch according to the fifth embodiment. FIG. 19 is a diagram illustrating the disposition of each portion of a semiconductor chip provided with the semiconductor switch. FIG. 20 is a cross-sectional view taken along line A-A of FIG. 19 as viewed in the direction of an arrow.

In the fifth embodiment, the substantially similar components as those in the first embodiment are denoted by the same reference numerals and signs and are not necessarily described here, and only differences in components will be described. The fifth embodiment is different from the first embodiment in that a conductive layer which is insulated and separated by being surrounded with an interlayer insulating film and which is electrified is provided between a high frequency wiring and a silicon oxide film.

First, the fifth embodiment will be described in association with a factor of generating charge carriers in the vicinity of an interface between a silicon substrate and a silicon oxide film.

In general, since fixed positive charges are present in the vicinity of an interface between a silicon substrate and a silicon oxide film, electrons as charge carriers are induced to the vicinity of the interface between the silicon substrate and the silicon oxide film.

However, a factor of inducing charge carriers to the vicinity of the interface between the silicon substrate and a silicon insulating film is not limited to fixed charges at the interface. For example, fixed charges, mobile ion charges, trapped charges, and the like are also present within an insulating film between layers in a multi-layer wiring and at an interface between the insulating films. Due to these charges, charge carriers are induced proximate to the interface between the silicon substrate and the silicon insulating film.

For this reason, the amount of charge carriers induced in a thermal equilibrium state is determined to satisfy charge neutral conditions in the entire structure of a semiconductor switch including a silicon substrate, elements provided on the silicon substrate, wirings, and the like.

For example, even though SOI substrates are the same, charge carrier concentrations induced to the vicinity of an interface between a BOX (buried oxide) layer and a silicon substrate are not necessarily the same in a region just below a MOSFET formed in a silicon layer on the BOX layer in the SOI substrate, a region just below a wiring formed through the BOX layer and an interlayer insulating film, and a region in which a conductive pattern is not present.

Further, when acceptor impurities are induced to the vicinity of the interface between the silicon substrate and the silicon oxide film, an excessive amount of acceptor impurities induced may result in holes in the vicinity of the interface between the silicon substrate and the silicon oxide film due to the excessive acceptor impurities that do not compensate for electrons induced to the vicinity of the interface.

In the semiconductor switch according to the fifth embodiment, a conductive layer which is insulated, separated, and electrified (charged) is provided in the vicinity of the interface between the silicon substrate and the silicon oxide film. Charge carriers in the vicinity of the interface between the silicon substrate and the silicon oxide film are determined so as to satisfy charge neutral conditions in the entire structure of the semiconductor switch inclusive of positive and negative of charges electrified on the conductive layer and the amount of charges.

As a result, it is possible to reduce the charge carriers in the vicinity of the interface between the silicon substrate and the silicon oxide film by the electrified conductive layer. Since charge carriers moved by an electric field due to a high frequency signal are reduced, it is possible to prevent distortion from occurring in the high frequency signal. It is possible to reduce the power loss of a high frequency wiring.

Next, a semiconductor switch according to the fifth embodiment will be described in detail.

As illustrated in FIG. 18, a semiconductor switch 100 according to the fifth embodiment is similar to the semiconductor switch 10 illustrated in FIG. 1 in terms of an overall circuit pattern, and a detailed description thereof will be omitted here. A dashed line surrounding a high frequency wiring RW0 indicates the presence of a conductive layer which is insulated and separated by being coated with an interlayer insulating film and which is electrified.

As illustrated in FIG. 19, the disposition of circuits and elements and the like in a semiconductor chip 101 according to the fifth embodiment is similar to those in the semiconductor chip 20 illustrated in FIG. 2 (though depicted page orientations are different), and a description thereof will be omitted here. A hatched region in FIG. 19 has a floating potential and indicates a region in which an electrified conductive layer is provided.

As illustrated in FIG. 20, in a semiconductor switch 100 according to the fifth embodiment, a conductive layer 102 is provided between the high frequency wiring RW0 (high frequency wiring 42) and a silicon substrate 103 and on a silicon oxide film (first insulating film) 32. The conductive layer 102 is coated with an interlayer insulating film (second insulating film) 41. That is, interlayer insulating film 41 is at least between high frequency wiring 42 and the conductive layer 102.

The silicon substrate 103 is a high resistance substrate. A first specific resistance ρ1 of the silicon substrate 103 is higher than a second specific resistance ρ2 of a silicon layer 33.

The conductive layer 102 is coated with the interlayer insulating film 41 so as to be electrically insulated from the silicon substrate 103, the silicon layer 33, semiconductor switch circuits SW1 to SW8, and high frequency wirings RW0 to RW8.

That is, the conductive layer 102 is not electrically connected to any high frequency wiring, the voltage source, the grounding wire, and/or other circuit elements, and has an electrically floating potential. For example, the conductive layer 102 is negatively electrified (negative potential). Charges 102a indicate charges accumulated on the conductive layer 102.

By the presence of the conductive layer 102, charges 102b (electrons) are induced to the vicinity of an interface between the silicon substrate 31 and the silicon oxide film 32 below the conductive layer 102 so as to satisfy electrical neutral conditions in the entire structure of the semiconductor switch 100 inclusive of the charges 102a. The amount of charges 102b is generally less than the amount of charges 102b induced when the conductive layer 102 is not present.

Charges 102c indicated by a dashed line schematically show "extra" charges which would be induced if the conductive layer 102 was not present. That is, when the conductive layer 102 is not present, both the charges 102b and the charges 102c are induced. When the conductive layer 102 is present, only the charges 102b are induced.

Since the conductive layer 102 is coated with the interlayer insulating film 41 and thus has an electrically floating potential, the electrification state of the conductive layer 102 is maintained for a relatively long time.

The material of the conductive layer 102 is not particularly limited as long as the material is capable of being coated with the interlayer insulating film 41 and being electrified (charged). The conductive layer 102 may be, for example, a metal such as Al or Cu, an alloy such as Al—Si or Al—Si—Cu, a metal compound, or a semiconductor such as doped p-type or n-type silicon or polysilicon. When the conductive layer 102 is silicon or polysilicon, a portion of the conductive layer 102 may be converted to a silicide with a high melting point metal.

When harmonic distortion characteristics of the semiconductor switch 100 are measured on an input of sinusoidal wave power having a frequency of 0.8 GHz and 25 dBm, a second or third harmonic distortion is improved by 1 dB to 9 dB by a semiconductor switch that does not include the conductive layer 102 is obtained.

Figure 21:
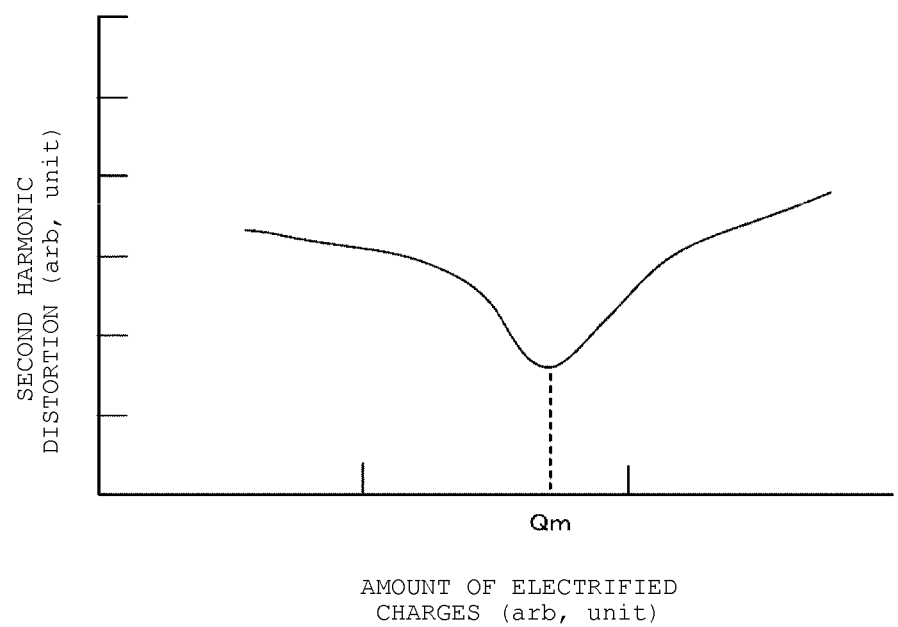
FIG. 21 is a diagram illustrating harmonic distortion characteristics of the semiconductor switch according to the fifth embodiment.

FIG. 21 is a schematic diagram illustrating a relationship between the amount of electrified charges of the conductive layer 102 and second harmonic distortion of a high frequency signal. In FIG. 21, a horizontal axis represents the amount of electrified charges, and a vertical axis represents second harmonic distortion.

As illustrated in FIG. 21, second harmonic distortion is reduced depending on the amount of electrified charges up to a certain amount (Qm). This shows that the amount of charge carriers (electrons) induced to the vicinity of an interface between the silicon substrate 31 and the silicon oxide film 32 has been reduced so as to satisfy electrical neutral conditions in response to an increase in the amount of electrified charges.

Further, when the amount of electrified charges increases past Qm, the second harmonic distortion increases depending on the amount of electrified charges is obtained. This is because eventually charge carriers (electrons) are compensated and then opposite charge carriers (holes) are induced in order to satisfy electrical neutral conditions in response to an increasing amount of electrified charges.

Similarly to the charge carriers (electrons), the charge carriers (holes) move by an electric field due to a high frequency signal, and thus harmonic distortion occurs in the frequency signal. Accordingly, it is optimum to set the amount of electrified charges of the conductive layer 102 to a value Qm in which second harmonic distortion shows a minimum value.

However, the amount of electrified charges of the conductive layer 102 is not limited to the value Qm in which second harmonic distortion shows a minimum value. Electrification may be performed within a range of values in which desired harmonic distortion characteristics are obtained.

Figure 22A:
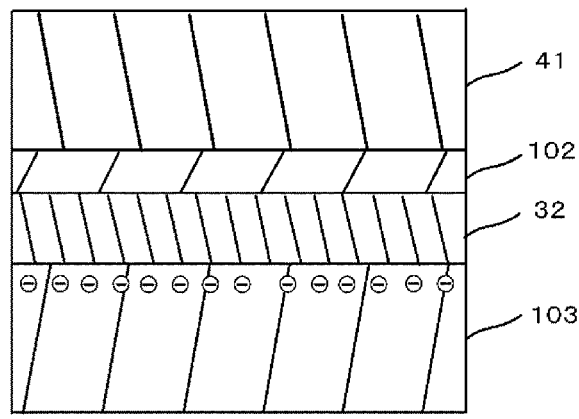
FIGS. 22A and 22B are cross-sectional views illustrating portions of a process of forming the semiconductor switch according to the fifth embodiment.
Figure 22B:
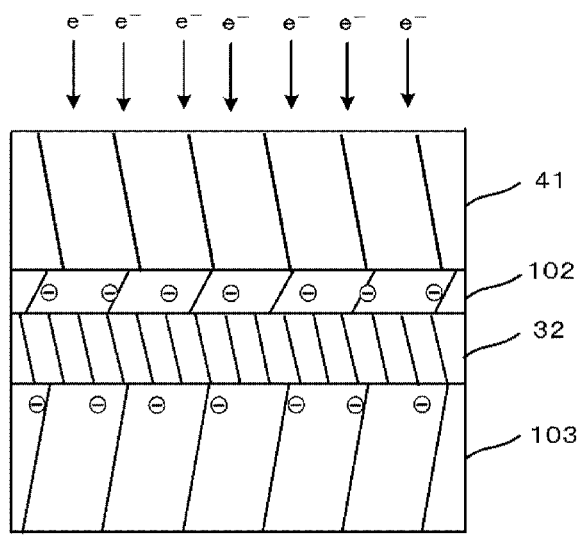

Next, a method of manufacturing the semiconductor switch 100 will be described. FIGS. 22A and 22B are cross-sectional views sequentially illustrating main portions in a process of injecting charged particles into the conductive layer 102 and electrifying the charged particles.

As illustrated in FIG. 22A, the conductive layer 102 is formed as a polysilicon layer doped with n-type impurities on the silicon oxide film 32 which has been exposed by removing the silicon layer 33 from an SOI substrate 30. The conductive layer 102 may be formed, for example, by a chemical vapor deposition (CVD) method.

A tetra ethyl ortho silicate (TEOS) film is formed on the conductive layer 102 as the interlayer insulating film 41, for example, by a CVD method. Thereby, the conductive layer 102 which is coated with the interlayer insulating film 41 and has a floating potential is obtained.

At this step, the conductive layer 102 is not electrified, and thus charge carriers (electrons) are induced to the vicinity of the interface between the silicon substrate 31 and the silicon oxide film 32.

Next, as illustrated in FIG. 22B, charged particles (electrons) are injected into the conductive layer 102 through the interlayer insulating film 41. An acceleration voltage required for electrons to pass through the interlayer insulating film 41 and reach the inside of the conductive layer 102 and a dose amount for obtaining the amount of electrified charges Qm giving a minimum value to the second harmonic distortion illustrated in FIG. 21 are appropriately used as conditions for injecting the charged particles (electrons).

The injection condition depends on the thickness of the interlayer insulating film 41 and the amount of electrified charges Qm. A calibration curve indicating a relationship between the injection condition and second harmonic distortion may be formed in advance.

As described above, in the semiconductor switch 100 according to the fifth embodiment, the conductive layer 102 is provided between the high frequency wiring RW0 (high frequency wiring 42) and the silicon substrate 31 and on the silicon insulating film 32. The conductive layer 102 is coated with the interlayer insulating film 41 and thus has a floating potential, and is electrified (charged).

As a result, charge carriers in the vicinity of the interface between the silicon substrate 31 and the silicon oxide film 32 are determined so as to satisfy charge neutral conditions in the entire structure of the semiconductor switch 100, inclusive of positive and negative of charges electrified on the conductive layer 102 and the amount of charges.

Accordingly, it is possible to reduce the charge carriers in the vicinity of the interface between the silicon substrate 31 and the silicon oxide film 32, as compared with a case where the conductive layer 102 is not present. Since the charge carriers moved by an electric field due to a high frequency signal are reduced, it is possible to prevent distortion from occurring in the high frequency signal. It is possible to reduce the power loss of a high frequency wiring.

Here, although a description is given of a case where the charge carriers induced to the vicinity of the interface between the silicon substrate 31 and the silicon oxide film 32 are electrons and the conductive layer 102 is negatively electrified, the conductive layer 102 may be positively electrified using positive ions as charged particles when the charged particles are holes. For example, hydrogen ions or helium ions having small mass are suitably used as cations.

Although a case where the conductive layer 102 is electrified by injecting charged particles (electrons) is described, the electrification may be performed using any of other methods, for example, a method of performing tunnel injection of electrons.

Figure 23A:
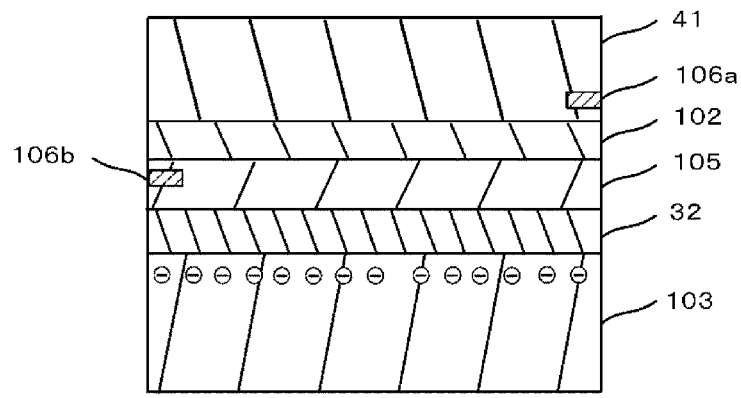
FIGS. 23A and 23B are cross-sectional views illustrating portions of a process of manufacturing the semiconductor switch according to the fifth embodiment.
Figure 23B:
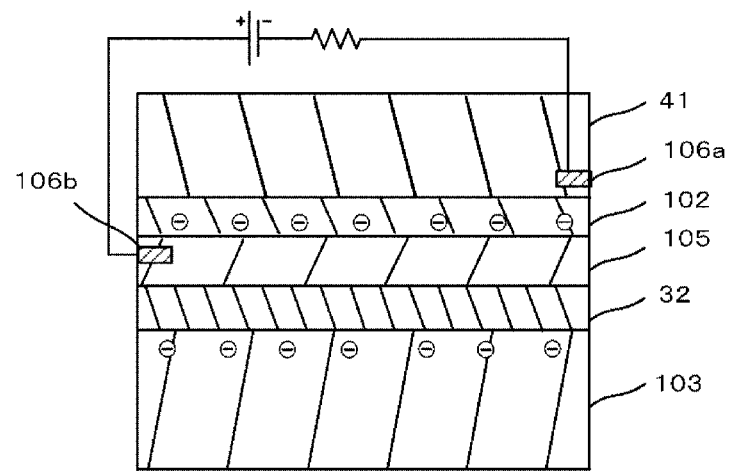

FIGS. 23A and 23B are cross-sectional views sequentially illustrating main portions of a process of performing tunnel injection of electrons into the conductive layer 102 and electrifying the electrons. This method is different from the method of injecting charged particles illustrated in FIGS. 22A and 22B in that the semiconductor switch 100 includes an electrode for performing tunnel injection of electrons.

As illustrated in FIG. 23A, an interlayer insulating film 105, for example, a TEOS film is formed on the silicon oxide film 32 by a CVD method. The conductive layer 102 and the interlayer insulating film 41 are sequentially formed on the interlayer insulating film 105.

Electrodes 106*a* and 106*b* for performing tunnel injection of electrons are formed in proximity to the conductive layer 102. In an example, the electrode 106*a* is a charge control electrode, and the electrode 106*b* is an electrode having a reference potential (GND).

The charge control electrode 106*a* is selectively provided on the conductive layer 102, for example, through a tunnel insulating film (not specifically depicted). For example, the reference electrode 106*b* is selectively provided on the side opposite to the side on which the charge control electrode 106*a* of the conductive layer 102 is provided, so as to be separated from the conductive layer 102.

In this step, the conductive layer 102 is electrified, and thus charge carriers (electrons) are induced to the vicinity of the interface between the silicon substrate 31 and the silicon oxide film 32.

As illustrated in FIG. 23B, the charge control electrode 106*a* is connected to the negative electrode of a power supply, and the reference electrode 106*b* is connected to the positive electrode of the power supply. When a negative voltage is applied to the charge control electrode 106*a*, a tunnel current is generated between the charge control electrode 106*a* and the conductive layer 102.

Thereby, electrons are injected into the conductive layer 102, and the conductive layer 102 is negatively electrified. As a result, charge carriers (electrons) in the vicinity of the interface between the silicon substrate 31 and the silicon oxide film 32 are reduced so as to satisfy electrical neutral conditions.

Figure 24A:
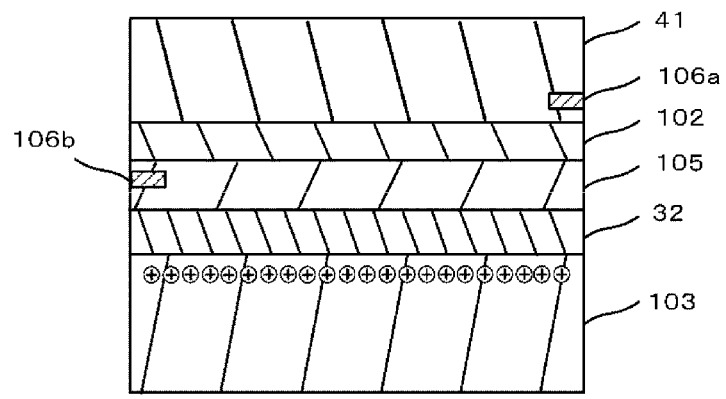
FIGS. 24A and 24B are cross-sectional views illustrating portions of a process of manufacturing the semiconductor switch according to the fifth embodiment.
Figure 24B:
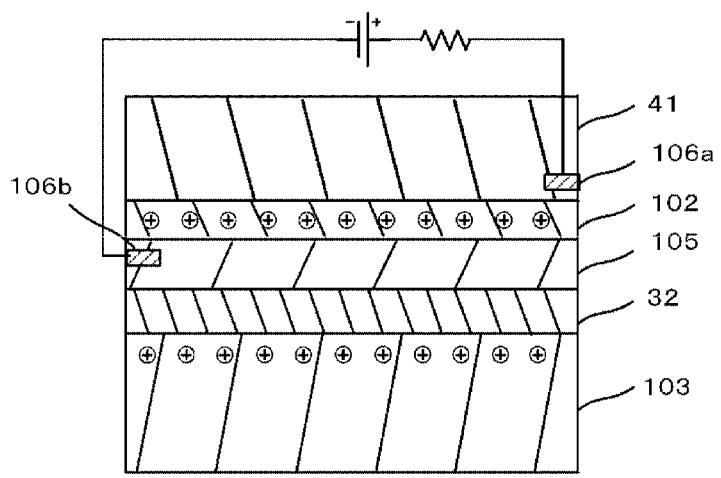

FIGS. 24A and 24B are cross-sectional views sequentially illustrating main portions in a process of positively electrifying the conductive layer 102 in a case where conductive layer 102 induced to the vicinity of the interface between the silicon substrate 31 and the silicon oxide film 32 are holes.

As illustrated in FIG. 24A, a process of providing the conductive layer 102, the electrodes 106*a* and 106*b*, and the like is the same as the process illustrated in FIG. 23A, and a description thereof will be omitted here.

In this step, the conductive layer 102 is electrified, and thus charge carriers (holes) are induced to the vicinity of the interface between the silicon substrate 31 and the silicon oxide film 32.

As illustrated in FIG. 24B, the charge control electrode 106*a* is connected to the positive electrode of a power supply, and the reference electrode 106*b* is connected to the negative electrode of the power supply. When a positive voltage is applied to the charge control electrode 106*a*, a tunnel current is generated between the charge control electrode 106*a* and the conductive layer 102.

Thereby, electrons are extracted from the conductive layer 102, and the conductive layer 102 is positively electrified. As a result, charge carriers (holes) in the vicinity of the interface between the silicon substrate 31 and the silicon oxide film 32 are reduced so as to satisfy electrical neutral conditions.

The application of a voltage to the charge control electrode 106*a* may be performed after the manufacture of the semiconductor switch is finished. Therefore, it is possible to apply a voltage to the charge control electrode 106*a* while or after monitoring harmonic characteristics of the manufactured semiconductor switch.

As a result, there is an advantage that the setting of the amount of electrified charges of the conductive layer 102 to a value Qm in which second harmonic distortion shows a minimum value is facilitated. Also, a large-scale device for injecting charged particles is not required.

A method of performing tunnel injection of electrons into the conductive layer 102 is not limited to the method illustrated in FIGS. 23A and 23B, and various methods are contemplated.

In addition, as another electrification method, the conductive layer 102 may be electrified by plasma treatment. The conductive layer 102 is exposed to, for example, argon plasma to be subjected to surface treatment, and thus it is possible to negatively electrify the surface of the conductive layer 102. Thereafter, the conductive layer 102 is coated with the interlayer insulating film 41.

The reason why the conductive layer 102 is negatively electrified is because electrons in plasma reach the surface to be treated earlier than argon ions. That is, as a characteristic of plasma, a potential (potential distribution) is formed on a certain surface so that the flux density of positive ions flying to the surface becomes equal to the flux density of electrons. This potential difference (sheath voltage) is set to be "negative" in ordinary low gas pressure glow discharge. This is because a state where negative charges, that is, electrons, are electrified on the surface is set to be a normal state by the amount by which the potential difference is set to be negative.

The electrodes 106*a* and 106*b* for performing tunnel injection of electrons into the conductive layer 102 are not necessary in this process, and thus there is an advantage that it is possible to simplify a process of manufacturing the semiconductor switch 100.

Further, it is also possible to coat the conductive layer 102 with the interlayer insulating film 41 while electrifying the conductive layer by using a plasma CVD method to form the interlayer insulating film 41. There is an advantage that the electrification and coating of the conductive layer 102 may be performed in one process. The number of processes of manufacturing the semiconductor switch 100 is reduced.

Sixth Embodiment

Figure 25:
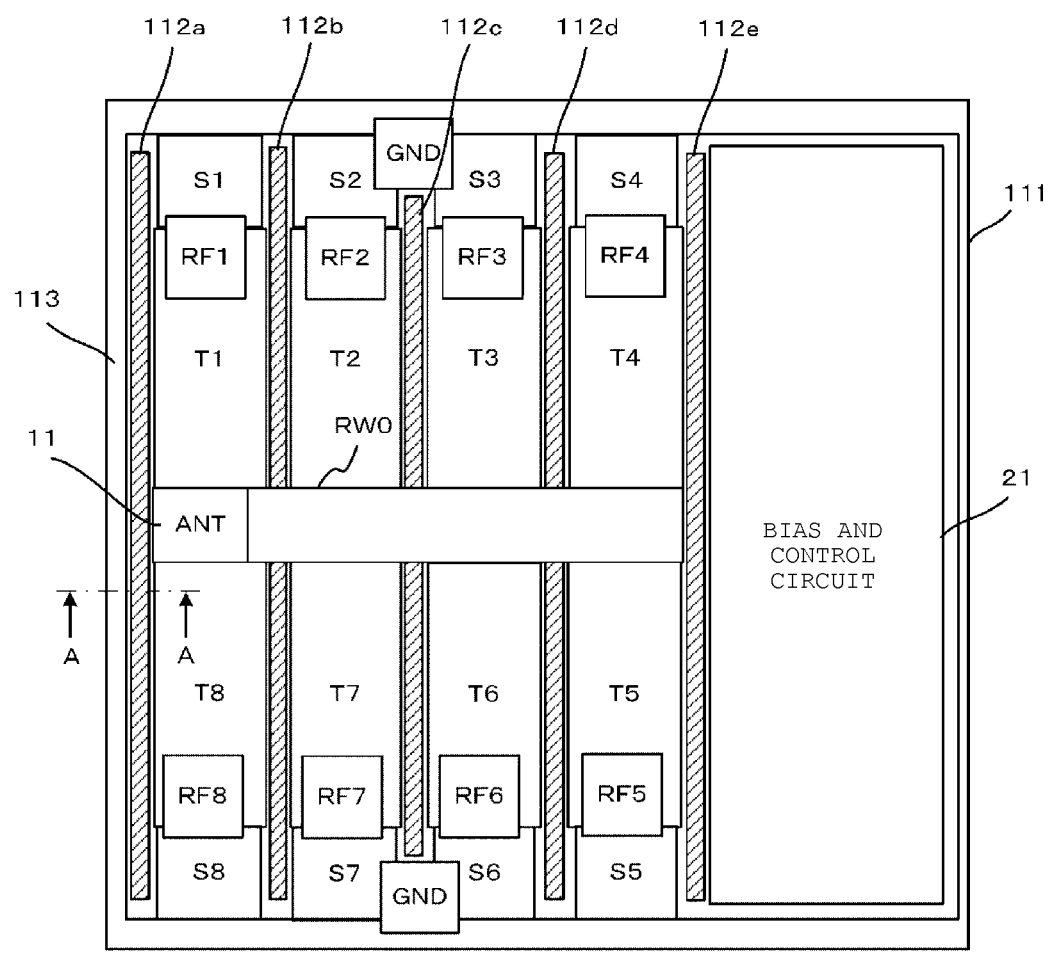
FIG. 25 is a diagram illustrating a semiconductor chip provided with a semiconductor switch according to a sixth embodiment.
Figure 26:
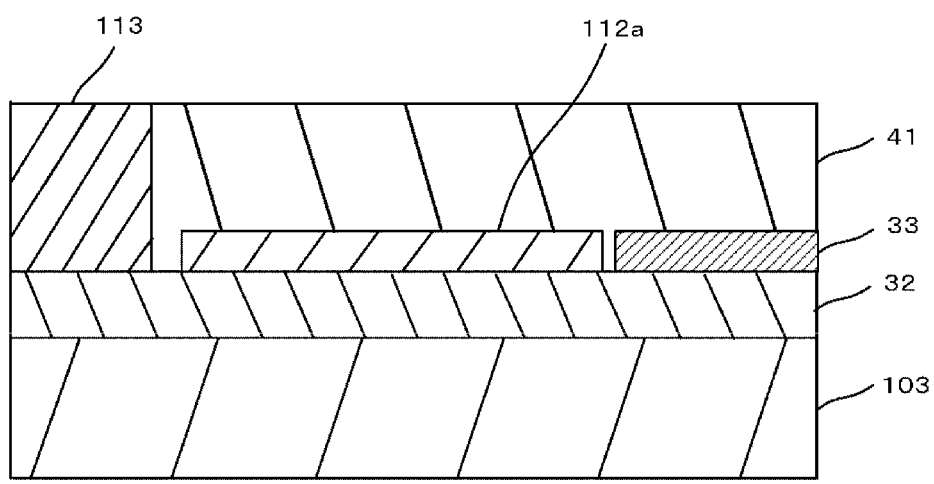
FIG. 26 is a cross-sectional view illustrating portions of the semiconductor switch according to the sixth embodiment.

A semiconductor switch according to the sixth embodiment will be described below with reference to FIGS. 25 and 26. FIG. 25 is a diagram illustrating the disposition of each portion of a semiconductor chip provided with the semiconductor switch. FIG. 26 is a cross-sectional view of the semiconductor switch taken along line A-A of FIG. 25 as viewed in the direction of an arrow.

In the sixth embodiment, substantially similar components as those in the first embodiment are denoted by the same reference numerals and signs and are not necessarily described here again, and only differences will be described. The sixth embodiment is different from the first embodiment in that a conductive layer which is insulated and separated by being coated with an interlayer insulating film and which is electrified is provided in a region in which wirings and circuit elements are not provided.

The region provided with no wirings and circuit elements refers to a region between any two of a high frequency wiring, a semiconductor switch circuit, a bias and control circuit, and a ground wiring.

That is, as illustrated in FIG. 25, a plurality of conductive layers 112a to 112e are provided in a semiconductor chip 111 provided with the semiconductor switch according to the sixth embodiment. The conductive layers 112a to 112e are insulated and separated by being coated with the interlayer insulating film 41, and are electrified.

Specifically, the conductive layer 112a is provided between a ground wiring 113 and each of a shunt transistor portion S1, a pass-through transistor portion T1, an antenna terminal 11, a pass-through transistor portion T8, and a shunt transistor portion S8.

The conductive layer 112b is provided between the shunt transistor portion S1 and a shunt transistor portion S2, between the pass-through transistor portion T1 and a pass-through transistor portion T2, between the pass-through transistor portion T8 and a pass-through transistor portion T7, and between the shunt transistor portion S8 and a shunt transistor portion S7.

The conductive layer 112c and the conductive layer 112d are the same as the conductive layer 112b, and a description thereof will be omitted here.

The conductive layer 112e is provided between a bias and control circuit 21 and each of a shunt transistor portion S4, a pass-through transistor portion T4, a high frequency wiring RW0, a pass-through transistor portion T5, and a shunt transistor portion S5.

Hereinafter, when the conductive layers 112a to 112e are collectively described, as such the layers are simply referred to, collectively, as a conductive layer 112.

Meanwhile, the ground wiring according to the sixth embodiment includes a region not only functioning as an explicit ground wiring but also effectively functioning as a ground wiring with respect to a high frequency signal. For example, a shunt transistor portion connected to a terminal transmitting and receiving a high frequency that is in a cut-off state electrically conducts with ground and effectively functions as a high frequency ground wiring.

Further, a bias circuit, a control signal circuit, a logic circuit, and the like included in the bias and control circuit 21 include a portion having a low impedance at a frequency at which a high frequency switch operates, and thus may effectively function as a high frequency ground wiring.

FIG. 26 is a cross-sectional view illustrating the conductive layer 112a provided between the ground wiring 113 and the pass-through transistor portion T8.

As illustrated in FIG. 26, the ground wiring 113 is provided on a silicon oxide film 32. The pass-through transistor portion T8, for example, is provided in a silicon layer 33 located on the silicon oxide film 32.

The conductive layer 112a is provided between the ground wiring 113 and the silicon layer 33 and on the silicon oxide film 32. The conductive layer 112a is insulated and separated by being coated with the interlayer insulating film 41, and is electrified.

The conductive layer 112 is provided on the sides of a high frequency wiring and a circuit. The conductive layer 112 is provided in a region where a wiring and a circuit are not provided, and thus it is possible to reduce charge carriers in the vicinity of an interface between the silicon substrate 31 and the silicon oxide film 32 over a wide range in addition to charge carriers below a high frequency wiring.

As a result, it is possible to stably obtain an effect of reducing harmonic distortion and the power loss of a high frequency wiring.

The conductive layer 112 is not required to be provided in all regions in which wirings and circuit elements are not provided, and the effect of the sixth embodiment can be obtained when the conductive layer 112 is provided in at least a portion of the region in which wirings and circuit elements are not provided.

As described above, in the semiconductor switch according to the sixth embodiment, a conductive layer which has a floating potential and is electrified is provided in a region where a wiring and a circuit are not provided.

As a result, it is possible to reduce charge carriers in the vicinity of the interface between the silicon substrate 31 and the silicon oxide film 32 over a wide range in addition to charge carriers below a high frequency wiring. It is possible to stably obtain an effect of reducing harmonic distortion and the power loss of a high frequency wiring.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In addition, configurations described in the following are disclosed.

(Variant 1) A semiconductor switch according to any applicable embodiment, in which a semiconductor switch circuit includes a field effect transistor and a polycrystalline semiconductor layer is formed of a same material as that of a gate wiring of the field effect transistor.

(Variant 2) A semiconductor switch according to any applicable embodiment, in which the polycrystalline semiconductor layer is directly on the first insulating film.

(Variant 3) The semiconductor switch according to any applicable embodiment, in which a third insulating film that is thinner than the first insulating film is on the first insulating film, and the polycrystalline semiconductor layer is on the third insulating film.

(Variant 4) The semiconductor switch according to any applicable embodiment, in which the semiconductor substrate includes a first portion that has a first specific resistance and a second portion that is provided on the first portion and has an impurity concentration higher than that of the first portion, and the first insulating film is provided on the second portion.

(Variant 5) The semiconductor switch according to any applicable embodiment, wherein a plurality of conductive cylinders are connecting the polycrystalline semiconductor layer and the semiconductor substrate, and the conductive cylinders are disposed at a first interval in a second direction having a predetermined angle with respect to a first direction in which the wiring extends, and are disposed at a second interval in the first direction. See e.g, FIG. 11A, FIG. 15A, FIG. 16A, and/or FIG. 17A.

What is claimed is:

1. A semiconductor switch, comprising:
   a first insulating film on a semiconductor substrate;
   a first semiconductor layer on the first insulating film;
   a semiconductor switch circuit on the first semiconductor layer;
   a wiring on the first insulating film, the first insulating film being between the wiring and the semiconductor substrate, the wiring connecting the semiconductor switch circuit and a first terminal; and
   a polycrystalline semiconductor layer between the wiring and the first insulating film and electrically isolated from the wiring.

2. The semiconductor switch according to claim 1, wherein a carrier concentration of the polycrystalline semiconductor layer is 1E20 cm$^{-3}$ or higher.

3. The semiconductor switch according to claim 1, wherein the polycrystalline semiconductor layer is covered by a second insulating film, which completely separates the polycrystalline semiconductor layer from the wiring.

4. The semiconductor switch according to claim 3, wherein the polycrystalline semiconductor layer is connected to a power supply potential through a via passing through the second insulating film.

5. The semiconductor switch according to claim 1, wherein the polycrystalline semiconductor layer is a polysilicon layer.

6. The semiconductor switch according to claim 5, wherein a silicide material is provided on the polysilicon layer.

7. The semiconductor switch according to claim 1, wherein the polycrystalline semiconductor layer extends in a direction parallel to the semiconductor substrate beyond an outer edge of the wiring.

8. The semiconductor switch according to claim 1, further comprising:
   a conductive cylinder connecting the polycrystalline semiconductor layer and the semiconductor substrate.

9. The semiconductor switch according to claim 1, further comprising:
   a charge trap level layer at an interface between the semiconductor substrate and the first insulating film, the charge trap level layer having a charge trap level concentration in a range of approximately 1E16 cm$^{-3}$ to approximately 1E18 cm$^{-3}$.

10. The semiconductor switch according to claim 9, wherein the charge trap level layer is a semiconductor layer containing electrically inactive impurities.

11. The semiconductor switch according to claim 1, wherein the polycrystalline semiconductor layer directly contacts the first insulating film.

12. The semiconductor switch according to claim 1, wherein the polycrystalline semiconductor layer is located immediately below the wiring.

13. The semiconductor switch according to claim 1, wherein the semiconductor switch circuit comprises:
    a first switch portion including first transistors connected in series between the wiring and a second terminal; and
    a second switch portion including second transistors connected in series between the second terminal and a ground terminal.

14. A semiconductor switch, comprising:
    a first insulating film on a semiconductor substrate;
    a first semiconductor layer on the first insulating film;
    a semiconductor switch circuit on the first semiconductor layer;
    a wiring on the first insulating film, the first insulating film being between the wiring and the semiconductor substrate, the wiring connecting the semiconductor switch circuit and a first terminal; and
    a second semiconductor layer between the wiring and the semiconductor substrate and having an impurity concentration that is higher than an impurity concentration of the first semiconductor layer, the second semiconductor layer being electrically isolated from the wiring.

15. The semiconductor switch according to claim 14, wherein a mobility of a carrier in the second semiconductor layer is lower than a mobility of a carrier in the semiconductor substrate.

16. The semiconductor switch according to claim 14, wherein the second semiconductor layer is a polycrystalline semiconductor layer.

17. The semiconductor switch according to claim 14, wherein the semiconductor switch circuit comprises:
    a first switch portion including first transistors connected in series between the wiring and a second terminal; and
    a second switch portion including second transistors connected in series between the second terminal and a ground terminal.

18. A semiconductor switch, comprising:
    a first insulating film on a semiconductor substrate;
    a first semiconductor layer on the first insulating film;
    a semiconductor switch circuit on the first semiconductor layer;
    a wiring on the first insulating film, the first insulating film being between the wiring and the semiconductor substrate, the wiring connecting the semiconductor switch circuit and a terminal;
    a polycrystalline semiconductor layer between the wiring and the first insulating film; and
    a conductive cylinder connecting the polycrystalline semiconductor layer and the semiconductor substrate.

* * * * *